(12) United States Patent
Paknejad

(10) Patent No.: US 10,923,454 B2
(45) Date of Patent: Feb. 16, 2021

(54) METHOD AND APPARATUS FOR CREATING A BOND BETWEEN OBJECTS BASED ON FORMATION OF INTER-DIFFUSION LAYERS

(71) Applicant: Seyed Amir Paknejad, London (GB)

(72) Inventor: Seyed Amir Paknejad, London (GB)

(*) Notice: Subject to any disclaimer, the term of this patent is extended or adjusted under 35 U.S.C. 154(b) by 50 days.

(21) Appl. No.: 15/176,567

(22) Filed: Jun. 8, 2016

(65) Prior Publication Data
US 2017/0117246 A1  Apr. 27, 2017

Related U.S. Application Data

(60) Provisional application No. 62/173,057, filed on Jun. 9, 2015.

(51) Int. Cl.
*H01L 23/00* (2006.01)

(52) U.S. Cl.
CPC .............. *H01L 24/83* (2013.01); *H01L 24/29* (2013.01); *H01L 24/32* (2013.01); *H01L 24/05* (2013.01);
(Continued)

(58) Field of Classification Search
CPC .............. H01L 2224/83203; H01L 2224/8383
See application file for complete search history.

(56) References Cited

U.S. PATENT DOCUMENTS 6,413,589 B1 * 7/2002 Li ........................... C22C 47/08
427/376.6
9,682,533 B1 * 6/2017 Gross ...................... B32B 15/04
(Continued)

FOREIGN PATENT DOCUMENTS

WO  WO-2015118790 A1 * 8/2015 ........... H05K 3/3463

OTHER PUBLICATIONS

"Summary of Properties of Elements," in CRC Handbook of Chemistry and Physics, 99th Edition, Internet Version 2018, John R. Rumble, ed., CRC Press/Taylor & Francis, Boca Raton, FL, first three pages. (Year: 2016).*

*Primary Examiner* — Kenneth Parker
*Assistant Examiner* — Scott E Bauman
(74) *Attorney, Agent, or Firm* — Bekiares Eliezer LLP

(57) ABSTRACT

The present disclosure provides a method of creating a bond between a first object and a second object. For example, creating a joint or die attach between a semiconductor chip and an electronic substrate, especially for harsh and high temperature environments. The method may include a step of filling a space between the first object and the second object with a filler material. Further, the method may include a step of heating the filler material to facilitate formation of a plurality of inter-diffusion layers. Accordingly, a first inter-diffusion layer may be formed between the filler material and the first object. Further, a second inter-diffusion layer may be formed between the filler material and the second object. Furthermore, in some embodiments, the first inter-diffusion layer may be contiguous with the second inter-diffusion layer. The contiguity may be facilitated by placement of at least one insert between the first object and the second object, in which the inter-diffusion of the filler material and the at least one insert may produce the third inter-diffusion layer, wherein the third inter-diffusion layer is contiguous with each of the first inter-diffusion layer and the second inter-diffusion layer.

18 Claims, 20 Drawing Sheets

(52) U.S. Cl.
CPC .... *H01L 24/27* (2013.01); *H01L 2224/04026* (2013.01); *H01L 2224/0562* (2013.01); *H01L 2224/05601* (2013.01); *H01L 2224/05609* (2013.01); *H01L 2224/05611* (2013.01); *H01L 2224/05613* (2013.01); *H01L 2224/05616* (2013.01); *H01L 2224/05617* (2013.01); *H01L 2224/05618* (2013.01); *H01L 2224/05624* (2013.01); *H01L 2224/05638* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/05669* (2013.01); *H01L 2224/05681* (2013.01); *H01L 2224/2612* (2013.01); *H01L 2224/276* (2013.01); *H01L 2224/29005* (2013.01); *H01L 2224/29011* (2013.01); *H01L 2224/29012* (2013.01); *H01L 2224/2912* (2013.01); *H01L 2224/29076* (2013.01); *H01L 2224/29078* (2013.01); *H01L 2224/29083* (2013.01); *H01L 2224/29101* (2013.01); *H01L 2224/29109* (2013.01); *H01L 2224/29111* (2013.01); *H01L 2224/29113* (2013.01); *H01L 2224/29116* (2013.01); *H01L 2224/29117* (2013.01); *H01L 2224/29118* (2013.01); *H01L 2224/29124* (2013.01); *H01L 2224/29138* (2013.01); *H01L 2224/29139* (2013.01); *H01L 2224/29144* (2013.01); *H01L 2224/29147* (2013.01); *H01L 2224/29155* (2013.01); *H01L 2224/29164* (2013.01); *H01L 2224/29166* (2013.01); *H01L 2224/29169* (2013.01); *H01L 2224/29181* (2013.01); *H01L 2224/29244* (2013.01); *H01L 2224/29294* (2013.01); *H01L 2224/29339* (2013.01); *H01L 2224/3201* (2013.01); *H01L 2224/3205* (2013.01); *H01L 2224/3207* (2013.01); *H01L 2224/32058* (2013.01); *H01L 2224/32227* (2013.01); *H01L 2224/32503* (2013.01); *H01L 2224/32507* (2013.01); *H01L 2224/831* (2013.01); *H01L 2224/83007* (2013.01); *H01L 2224/8342* (2013.01); *H01L 2224/8381* (2013.01); *H01L 2224/8383* (2013.01); *H01L 2224/8384* (2013.01); *H01L 2224/83101* (2013.01); *H01L 2224/83191* (2013.01); *H01L 2224/83192* (2013.01); *H01L 2224/83203* (2013.01); *H01L 2224/83365* (2013.01); *H01L 2224/83385* (2013.01); *H01L 2224/83401* (2013.01); *H01L 2224/83409* (2013.01); *H01L 2224/83411* (2013.01); *H01L 2224/83413* (2013.01); *H01L 2224/83416* (2013.01); *H01L 2224/83417* (2013.01); *H01L 2224/83418* (2013.01); *H01L 2224/83424* (2013.01); *H01L 2224/83438* (2013.01); *H01L 2224/83439* (2013.01); *H01L 2224/83444* (2013.01); *H01L 2224/83447* (2013.01); *H01L 2224/83455* (2013.01); *H01L 2224/83464* (2013.01); *H01L 2224/83466* (2013.01); *H01L 2224/83469* (2013.01); *H01L 2224/83481* (2013.01); *H01L 2924/0103* (2013.01); *H01L 2924/0105* (2013.01); *H01L 2924/01013* (2013.01); *H01L 2924/01014* (2013.01); *H01L 2924/01022* (2013.01); *H01L 2924/01028* (2013.01); *H01L 2924/01029* (2013.01); *H01L 2924/01032* (2013.01); *H01L 2924/01046* (2013.01); *H01L 2924/01047* (2013.01); *H01L 2924/01048* (2013.01); *H01L 2924/01049* (2013.01); *H01L 2924/01051* (2013.01); *H01L 2924/01073* (2013.01); *H01L 2924/01078* (2013.01); *H01L 2924/01079* (2013.01); *H01L 2924/01082* (2013.01); *H01L 2924/01083* (2013.01)

(56) References Cited

U.S. PATENT DOCUMENTS

| | | | |
|---|---|---|---|
| 2008/0220282 A1* | 9/2008 | Jang | B32B 15/08 428/689 |
| 2009/0162557 A1* | 6/2009 | Lu | B22F 1/0059 427/383.3 |
| 2012/0003465 A1* | 1/2012 | Rittner | B22F 1/0003 428/323 |
| 2012/0244448 A1* | 9/2012 | Hallum | H01M 8/124 429/409 |
| 2014/0042603 A1* | 2/2014 | Hosseini | H01L 24/29 257/676 |
| 2014/0138843 A1* | 5/2014 | Meyer-Berg | H01L 21/561 257/774 |
| 2014/0252578 A1* | 9/2014 | Berlin | H01L 23/49575 257/676 |
| 2016/0181123 A1* | 6/2016 | Terasaki | H01L 23/3735 228/122.1 |
| 2016/0219720 A1* | 7/2016 | Strogies | H01L 24/33 |
| 2016/0351523 A1* | 12/2016 | Yamazaki | H01L 24/36 |

* cited by examiner

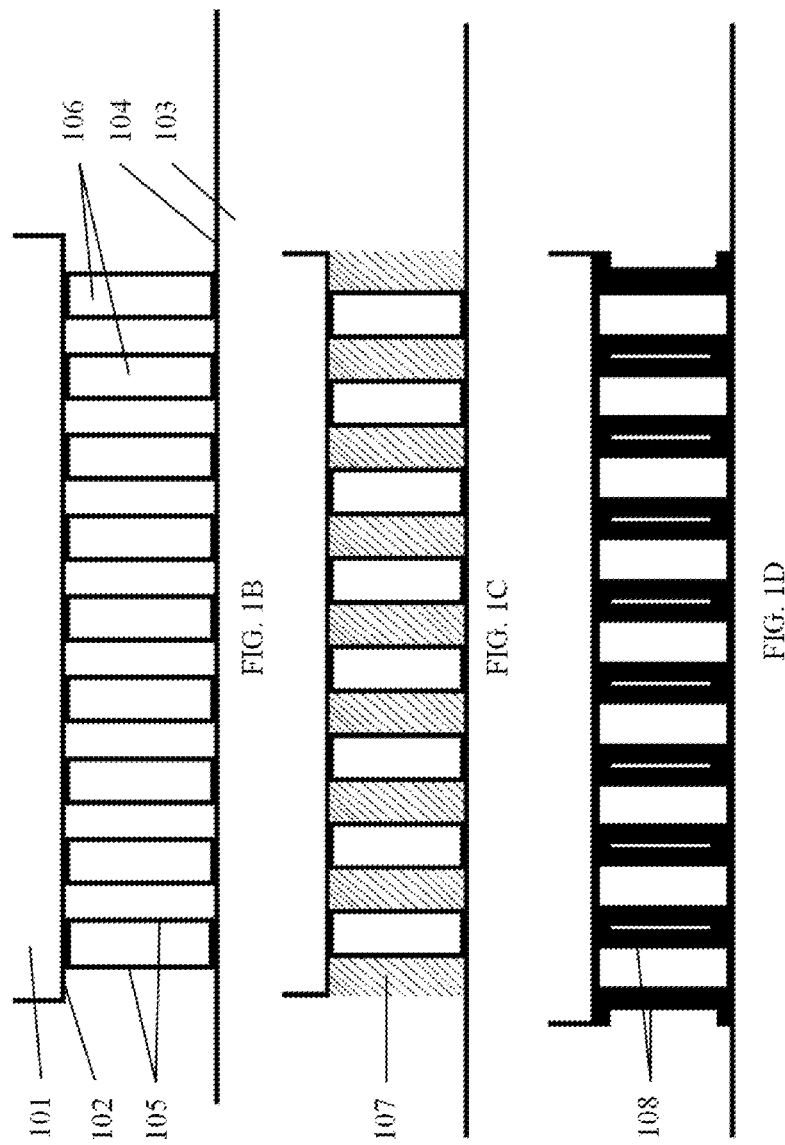

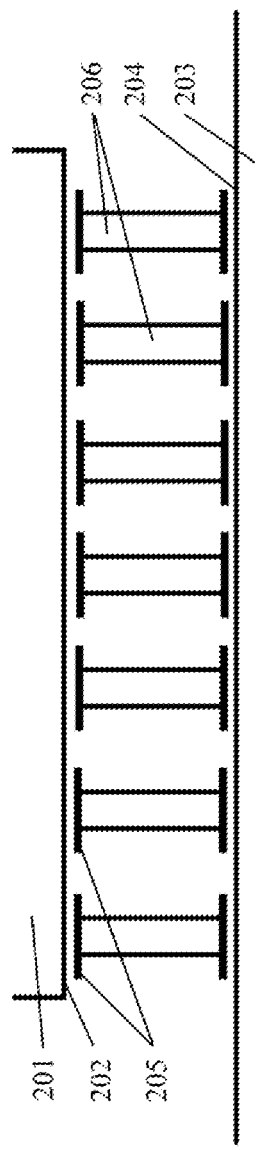
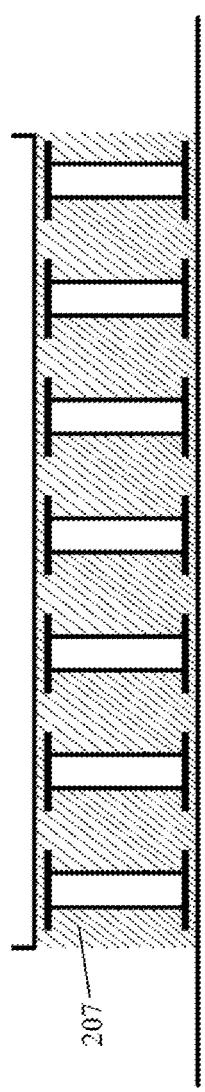
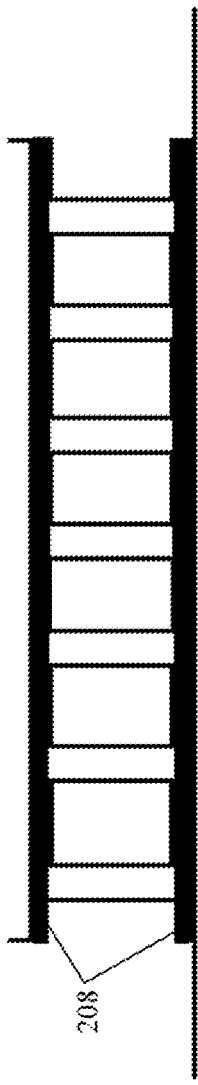
FIG. 2A
FIG. 2B
FIG. 2C

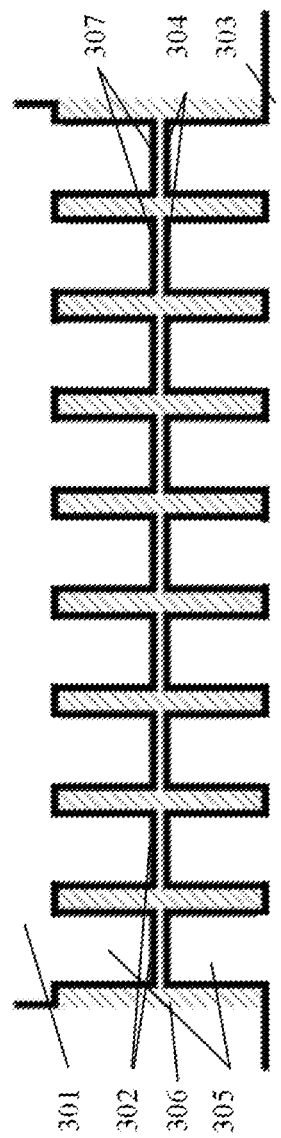
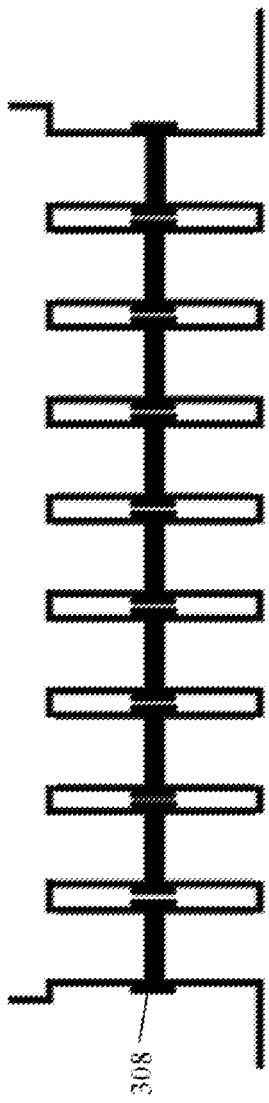
FIG. 3B
FIG. 3C

METHOD AND APPARATUS FOR CREATING A BOND BETWEEN OBJECTS BASED ON FORMATION OF INTER-DIFFUSION LAYERS

RELATED APPLICATION

Under provisions of 35 U.S.C. § 119(e), the Applicant claims the benefit of U.S. provisional application No. 62/173,057, filed Jun. 9, 2015, which is incorporated herein by reference.

It is intended that each of the referenced applications may be applicable to the concepts and embodiments disclosed herein, even if such concepts and embodiments are disclosed in the referenced applications with different limitations and configurations and described using different examples and terminology.

FIELD OF DISCLOSURE

The present disclosure generally relates to creating a bond between objects based on formation of inter-diffusion layers. More specifically, the present disclosure relates to creating a bond between metallic objects through formation of a contiguous inter-diffusion layer.

BACKGROUND

The required operating temperature for some electronic applications such as, for example, deep oil exploration, aerospace, and automotive, have increased beyond the current available die attach materials. The current aim now exceeds more than 250° C. for long periods of time, for example a few years. One important issue of the current high temperature die attach materials is the lead content, which has environmental hazards and its poisonous nature to species. On the other hand, the reliability of the current die attach materials deteriorates while being stored at high temperatures, and testing these materials can be very time consuming before being operational. Therefore, there is a need for die attach materials without any harmful elements or chemicals, which can withstand high temperatures of more than 250° C. for long periods of time without showing any loss of strength over conventional high temperature storage tests to fulfil the reliability requirement for the long operation times.

When two materials are in contact, inter-diffusion at the interface between them may improve their adhesion. However, this phenomenon may result in reduction of adhesion strength to a third material. The inter diffusion of the first and second material, such as, for example, the mating surface of substrate and die attach material, may weaken the attachment to the third material, such as, for example, the die.

BRIEF OVERVIEW

A thermally resistant connection for high temperature die attachments may be provided. This brief overview is provided to introduce a selection of concepts in a simplified form that are further described below in the Detailed Description. This brief overview is not intended to identify key features or essential features of the claimed subject matter. Nor is this brief overview intended to be used to limit the claimed subject matter's scope.

An object with a mating surface may attach to another object with another mating surface by creating an inter-diffusion layer. The inter-diffusion layer may be supplemented by an insert layer. Furthermore, the inter-diffusion layer may be supplemented by varying the surface geometry of either or both of the objects to be attached.

Accordingly, in some embodiments, the present disclosure provides a method of creating a bond between a first object and a second object. In some embodiments, the first object may be comprised in a substrate, such as for example, a semiconductor substrate. Accordingly, the second object may be comprised in a semiconductor die. Accordingly, the bond may facilitate attaching of the semiconductor die to the substrate.

The method may include a step of filling a space between the first object and the second object with a filler material. Further, in some embodiments, the filler material may be a bonding material. For instance, the filler material may include sintered silver nanoparticles.

Further, the method may include a step of heating the filler material to facilitate formation of a plurality of inter-diffusion layers.

Due to the heating, a first inter-diffusion layer may be formed between the filler material and the first object. Further, a second inter-diffusion layer may be formed between the filler material and the second object. The plurality of inter-diffusion layers may provide a physical bond between the first object and the second object. Further, in some embodiments, the plurality of inter-diffusion layers may provide at least one of a thermal conduction and electrical conduction between the first object and the second object.

Furthermore, in some embodiments, the first inter-diffusion layer may be contiguous with the second inter-diffusion layer. For example, when the spacing between the first object and the second object is reduced, the first inter-diffusion layer may overlap with the second inter-diffusion layer. Alternatively and/or additionally, the material characteristics of the first object, the filler material and the second object may be such that an extent of inter-diffusion may be large enough to result in an overlap of the inter-diffusion layer with the inter-diffusion layer.

In some embodiments, contiguity of the first inter-diffusion layer with the second inter-diffusion layer may further enhance mechanical, thermal and/or electrical characteristics of the bond between the first object and the second object.

Further, in some embodiments, a space between the first object and the second object may include at least one insert. Accordingly, in some embodiments, the method may further include placing the at least one insert in the space.

Further, in some embodiments, the at least one insert may be comprised in at least one of the first object and the second object. Accordingly, the method may further include a step of forming the at least one insert on at least one of the first object and the second object. The forming of the at least one insert may be performed using techniques such as etching, depositing, milling, patterning and so on.

Additionally, as result of the heating, a third inter-diffusion layer may be formed between the at least one insert and the filler material. Further, the third inter-diffusion layer may be contiguous with each of the first inter-diffusion layer and the second inter-diffusion layer. As a result, the use of the at least one insert may facilitate formation of a contiguous plurality of inter-diffusion layers.

Both the foregoing brief overview and the following detailed description provide examples and are explanatory only. Accordingly, the foregoing brief overview and the following detailed description should not be considered to be restrictive. Further, features or variations may be provided in addition to those set forth herein. For example, embodiments may be directed to various feature combinations and sub-combinations described in the detailed description.

BRIEF DESCRIPTION OF THE DRAWINGS

The accompanying drawings, which are incorporated in and constitute a part of this disclosure, illustrate various embodiments of the present disclosure. The drawings contain representations of various trademarks and copyrights owned by the Applicants. In addition, the drawings may contain other marks owned by third parties and are being used for illustrative purposes only. All rights to various trademarks and copyrights represented herein, except those belonging to their respective owners, are vested in and the property of the Applicants. The Applicants retain and reserve all rights in their trademarks and copyrights included herein, and grant permission to reproduce the material only in connection with reproduction of the granted patent and for no other purpose.

Furthermore, the drawings may contain text or captions that may explain certain embodiments of the present disclosure. This text is included for illustrative, non-limiting, explanatory purposes of certain embodiments detailed in the present disclosure. In the drawings:

FIGS. 1B, 1C and 1D illustrate a cross section, showing formation of a connection or attachment of two surfaces by formation of a continuous inter-diffusion layer from one of the surfaces to another, in which placement of inserts in between the surfaces establishes the continuity;

FIGS. 2A, 2B and 2C illustrate a cross section, showing formation of a connection or attachment of a surface to another surface by formation of a continuous inter-diffusion layer from one of the surfaces to an insert and another continuous inter-diffusion layer from that insert to the other surface;

FIGS. 3B and 3C illustrate a cross section, showing formation of a connection or attachment by diffusion of a material inside the gap between the two surfaces, which is formed by continuous inter-diffusion layer inside the gap from one of the surface to the other surface;

DETAILED DESCRIPTION

Figure 1A:
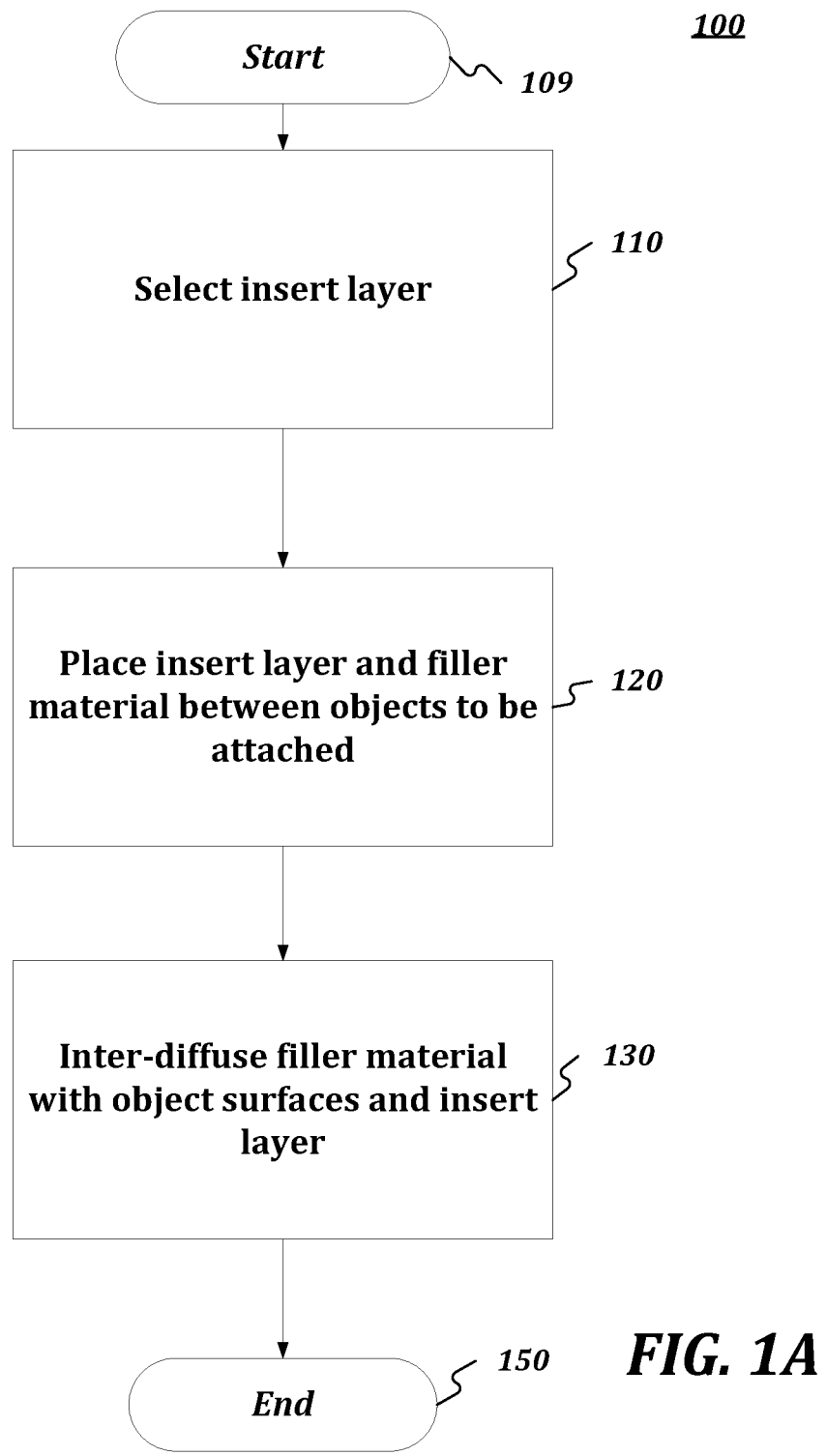
FIG. 1A illustrates a method for formation of a connection or attachment of two surfaces by formation of a continuous inter-diffusion layer from one of the surfaces to another, in which placement of inserts in between the surfaces establishes the continuity.

As a preliminary matter, it will readily be understood by one having ordinary skill in the relevant art that the present disclosure has broad utility and application. As should be understood, any embodiment may incorporate only one or a plurality of the above-disclosed aspects of the disclosure and may further incorporate only one or a plurality of the above-disclosed features. Furthermore, any embodiment discussed and identified as being "preferred" is considered to be part of a best mode contemplated for carrying out the embodiments of the present disclosure. Other embodiments also may be discussed for additional illustrative purposes in providing a full and enabling disclosure. As should be understood, any embodiment may incorporate only one or a plurality of the above-disclosed aspects of the display and may further incorporate only one or a plurality of the above-disclosed features. Moreover, many embodiments, such as adaptations, variations, modifications, and equivalent arrangements, will be implicitly disclosed by the embodiments described herein and fall within the scope of the present disclosure.

Accordingly, while embodiments are described herein in detail in relation to one or more embodiments, it is to be understood that this disclosure is illustrative and exemplary of the present disclosure, and are made merely for the purposes of providing a full and enabling disclosure. The detailed disclosure herein of one or more embodiments is not intended, nor is to be construed, to limit the scope of patent protection afforded in any claim of a patent issuing here from, which scope is to be defined by the claims and the equivalents thereof. It is not intended that the scope of patent protection be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection is to be defined by the issued claim(s) rather than the description set forth herein.

Additionally, it is important to note that each term used herein refers to that which an ordinary artisan would understand such term to mean based on the contextual use of such term herein. To the extent that the meaning of a term used herein—as understood by the ordinary artisan based on the contextual use of such term—differs in any way from any particular dictionary definition of such term, it is intended that the meaning of the term as understood by the ordinary artisan should prevail.

Regarding applicability of 35 U.S.C. § 112, ¶6, no claim element is intended to be read in accordance with this statutory provision unless the explicit phrase "means for" or "step for" is actually used in such claim element, whereupon this statutory provision is intended to apply in the interpretation of such claim element.

Furthermore, it is important to note that, as used herein, "a" and "an" each generally denotes "at least one," but does not exclude a plurality unless the contextual use dictates otherwise. When used herein to join a list of items, "or" denotes "at least one of the items," but does not exclude a plurality of items of the list. Finally, when used herein to join a list of items, "and" denotes "all of the items of the list."

The following detailed description refers to the accompanying drawings. Wherever possible, the same reference numbers are used in the drawings and the following description to refer to the same or similar elements. While many embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims. The present disclosure contains headers. It should be understood that these headers are used as references and are not to be construed as limiting upon the subjected matter disclosed under the header.

The present disclosure includes many aspects and features. Moreover, while many aspects and features relate to, and are described in, the context of die attachments, embodiments of the present disclosure are not limited to use only in this context. Furthermore, although various embodiments are disclosed with reference to a two-object operating environment, a plurality of objects may be attached using the methods and systems disclosed herein. Other applications consistent with embodiments disclosed herein may be used with, for example, wire bonding and welding.

I. Overview

Consistent with embodiments of the present disclosure, a thermally resistant connection for high temperature die attachments may be provided. This overview is provided to introduce a selection of concepts in a simplified form that are further described below. This overview is not intended to identify key features or essential features of the claimed subject matter. Nor is this overview intended to be used to limit the claimed subject matter's scope. The thermally resistant connection for high temperature die attachments may be used by individuals or companies to create a die attachment connection that can operate at and withstand high temperatures.

High temperature die attachment may be used for attaching, for example, electronic components to an electronic substrate in applications such as, for example, deep oil exploration, aerospace, and automotive applications. Embodiments of the present disclosure may create an attachment with the use of an inter-diffusion layer.

The inter-diffusion layer may be created, at least in part, with the use of an insert layer. The insert layer may sit between the objects to be attached. The insert layer may have space for inserting a filler material, such as, for example, a bonding material. Further, the insert layer material may have a custom profile. The custom profile may be selected or determined based on a desired properties of the attachment (e.g., thermal connectivity, porosity, and the like). Accordingly, the insert layer may be comprised of, for example, a mesh screen of a specified density. Alternatively, or in addition to the insert layer, the surface profiles of the objects to be attached may be contoured to further enable inter-diffusion between the objects. For example, in some embodiments, the objects may have contours deposited, patterned or milled out.

The space between the objects and the insert layer may further be filled with a filler material. The filler material may be, for example, but not limited to, a bonding material. The filler material may diffuse with at least one of the other materials during the inter-diffusion process.

Advantages over prior art may include:
1) Lead-free high temperature die attach, which has environmental benefits;
2) No need to reach melting point of any element, which is an advantage over Solid-Liquid Inter-Diffusion (SLID) systems;
3) No need to reach high processing temperatures close to the melting point of the die attach materials, which can prevent formation of residual stresses inside the joint;
4) No need to use applied processing pressure on the die, which is advantageous over both SLID, micro and nano-particle sintering, and diffusion wielding (diffusion bonding) techniques;
5) The system strengthens over time at high temperatures;
6) Controlled porosity;
7) Easy prediction of the final structure after storage at high temperature and control over design of the final required structure;
8) Formation of a mostly void free layer as a section or all of the joint or interconnect as a result of the continuous inter-diffusion layer;
9) Can be used for large die sizes, which is an advantage over sintering techniques, which have problem with build-up of combusted organics inside the die attach, which can reduce the die attach strength, and also large die sizes can prevent oxygen penetration and stop perfect sintering to occur in the center; and
10) Controllable thermal and electrical conductivity as a result of selection of the material combinations and desired inter-diffusion layer.

Both the foregoing overview and the following detailed description provide examples and are explanatory only. Accordingly, the foregoing overview and the following detailed description should not be considered to be restrictive. Further, features or variations may be provided in addition to those set forth herein. For example, embodiments may be directed to various feature combinations and sub-combinations described in the detailed description.

II. Configuration

An operating environment associated with embodiments of the present disclosure may be comprised of two objects to be connected by die attachment. For example, one object may be an electrical component and the other object may be a substrate. The objects may have various surface conditions and profiles.

The objects may be connected by a continuous inter-diffusion layer. In some embodiments, the inter-diffusion layer may be supplemented with an insert layer. The insert layer may be placed between the two objects. The insert layer may take the form of a variety of shapes and sizes. The form of the insert layer may be designed to accommodate instruments, such as, for example, wires with cross sections within the operating environment. Moreover, the top and bottom surfaces of the insert layer may vary depending based on the characteristics of the operating environment, including, for example, properties of the objects being attached. For example, the surfaces may be conductive or nonconductive.

The one or more of the bonding surfaces (e.g., mating surface) of the objects may be contoured to enhance diffusion and contiguity of the inter-diffusion layers. For example, profiles may be deposited into or patterned or milled out of an object's surface.

Constituent with embodiments of the present disclosure, the surface profile of the objects, the insert layer in between the objects, or both, may create a space between the objects. The space between the objects, in turn, may further be filled with a filler material. The filler material is preferably a bonding material.

In some embodiments, the inter-diffusion layer may be formed chemically to form an intermetallic inter-diffusion layer. In other embodiments, the inter-diffusion layer may be formed without chemical reactions to form a miscible mixture. Still in other embodiments, the inter-diffusion layer may form a combination of intermetallic compounds and miscible mixtures.

III. Operation

Although the stages illustrated by the flow charts are disclosed in a particular order, it should be understood that the order is disclosed for illustrative purposes only. Stages may be combined, separated, reordered, and various intermediary stages may exist. Accordingly, it should be understood that the various stages illustrated within the flow charts may be, in various embodiments, performed in arrangements that differ from the ones illustrated. Moreover, various stages may be added or removed from the flow charts without altering or deterring from the fundamental scope of the depicted methods and systems disclosed herein. Ways to implement the stages of methods 100, 300, 1100, 1200, 1300, 1400 and 1500 will be described in greater detail below.

FIG. 1A is a flow chart setting forth the general stages involved in a method 100 consistent with an embodiment of the disclosure for providing a thermally resistant connection for high temperature die attachments. Method 100 illustrates a method for forming a connection or attachment of two surfaces by formation of a continuous inter-diffusion layer from one of the surfaces to another, in which placement of inserts in between the surfaces establishes the continuity.

FIGS. 1B, 1C and 1D illustrate a cross section, showing formation of a connection or attachment of two surfaces by formation of a continuous inter-diffusion layer from one of the surfaces to another, in which placement of inserts in between the surfaces establishes the continuity.

Method 100 may begin at starting block 109 and proceed to stage 110, where an insert layer is selected. An object 101, which may be, for example, an electronic component, with a mating surface 102 is subject to attachment or establishment of a connection to object 103, which may be, for example, an electronic substrate, with mating surface 104. Inserts 106 (e.g., may be one or more inserts, without altering the scope of the present disclosure), in this case represented as bars with rectangular cross sections, may have any shapes and sizes depending on the application and instruments, such as, for example, wires with circular cross sections. Inserts 106 may have surfaces 105.

From stage 110, where the insert layer is selected, method 100 may proceed to stage 120, where the insert layer and filler material may be placed between objects to be attached. The inserts may be placed in between the mating surfaces 102 and 104. The space formed by the separation between the mating surfaces 102 and 104, while the inserts are there, may be filled with a material 107, as shown in FIG. 1C. In various embodiments, material 107 is preferentially a bonding material.

From stage 120, where the insert layer and filler material is placed between the objects to be attached, method 100 may proceed to stage 130, where the materials may be inter-diffused. Inter-diffusion of the material 107 with mating surfaces 102, 104, and 105 may form a continuous inter-diffusion layer 108. The continuous inter-diffusion layer 108 may form an interconnection, joint or attachment of object 101 to object 103.

The inter-diffusion mechanism depends on the application, such as, for example, thermal diffusion for high temperature electronic applications, or diffusion as a result of high current density in power electronics applications. As an example, this inter-diffusion layer may be formed by a chemical reaction and, for example, form an intermetallic compound, or without chemical reaction and, for example, form a miscible mixture of materials 107 and materials on the mating surfaces 102, 104 and surfaces 105. The continuous inter-inter-diffusion layer can also be a mixture of an intermetallic layer with a miscible mixture.

If the desired bond properties between the two objects are reached, method 100 may end at stage 150. Alternatively, the materials may be modified to produce the desired bond properties.

For improvements on the mechanical abilities of the continuous inter-diffusion layers 108, the shape and separation of the inserts 106 may be optimized, which can be dependent on the properties of the inter-diffusions and the initial characterizations of materials 107 and mating surfaces' 102, 104 and 105 materials.

This inter-diffusion may result in movement of atoms of the filler material 107 towards the surfaces 102, 104 and 105. Therefore, the initial porosity of the mating surfaces 102, 104 and 105 or the material 107 may be used to end up with final desired porosity shown in FIG. 1D inside the continuous inter-diffusion layer 108. The initial design and shape of the inserts and mating surfaces may be varied to form the required final pores inside the continuous inter-diffusion layer. Also, this technique may enable control over the porosity after establishment of the diffusion mechanisms. For example, by increasing the initial porosity of material 107, the flexibility of the final assembly may be improved. Alternatively, reduction in the porosity and reduction in the horizontal widths of inserts 106 may cause the continuous inter-diffusion layers 108 to thicken and therefore strengthen for better mechanical performance. While the above examples are used to show possible outcomes, results may vary depending on the application.

To enable the inter-diffusions, the mixing energy of the materials 107 with mating surfaces 102, 104, and 105 may be lower than their unmixed energy to increase the attraction for diffusion. In addition, this inter-diffusion layer may also result in a chemical reaction to form an element or molecule as the continuous inter-diffusion layer, such as an intermetallic compound.

One example of this method may be utilized in attachment of an electronic chip to a substrate with gold mating surfaces. The method may begin by filling a gold mesh (with for example 20 μm thickness, square holes with 30 μm length and 5 μm bar width) with a silver bonding material. Next, the method may continue by placing the filled gold mesh in between the substrate and chip. The silver bonding materials can be made out of silver nanoparticle (NP) paste. The silver NP paste may then be sintered as a bonding material after placement between the chip and substrate. One benefit of silver nanoparticles may be formation of many grain and twin boundaries inside the sintered materials [S. A. Paknejad, G. Dumas, G. West, G. Lewis, S. H. Mannan, Microstructure evolution during 300° C. storage of sintered Ag nanoparticles on Ag and Au substrates, Journal of Alloys and Compounds, Volume 617, 25 Dec. 2014, Pages 994-1001, ISSN 0925-8388, http://dx.doi.org/10.1016/j.jallcom.2014.08.062.]. The high concentration of the grain and twin boundaries may increase the rate of the diffusion mechanisms and speed up the formation of the continuous inter-diffusion layer. Also, the sintered silver NPs can have initial porosity of for example 20%, which after the diffusions will end up in the middle of the continuous inter-diffusion layer, which may finally produce the assembly shown in FIG. 1D.

This design enables densification of the continuous inter-diffusion layer at high temperatures. Such densification of the continuous inter-diffusion layer at high temperatures may emphasize on the fact that high temperatures can increase the mechanical strength of the joint till the diffusion stops and may leave a stable structure at high temperatures. (See "Thermally stable high temperature die attach solution." Materials & Design 89 (2016): 1310-1314. http://dx.doi.org/10.1016/j.matdes.2015.10.074 by Paknejad, Seyed Amir, Ali Mansourian, Yohan Noh, Khalid Khtatba, and Samjid H. Mannan.)

The top and bottom surfaces of the inserts 106 may vary depending on the application. For example, they may be conductive or nonconductive.

The inserts may be in any form and sizes. Some examples of inserts may include electrodeposited mesh structures with parallel or crossing bars or wires, and woven mesh structures. The inserts may also be patterned, grown, and/or deposited on the object 101 and/or object 103.

The density of the inserts 106 may vary in different locations between objects 101 and 103. For example, at the center the density may be higher to increase the mechanical strength, while, closer to the edges, the density may be lower or with diagonal orientations to compensate for the coefficient of thermal expansion mismatch between the objects 101 and 103 and the inserts 106.

Further, in some embodiments, the at least one insert 106 may be configured to enable a gap within the at least one insert 106 or a gap between at least a couple of inserts to reach an edge of at least one of the first object 101 and the second object 103. Further, the gap allows vapors to travel into a space surrounding at least one of the first object 101 and the second object 103. Method 100 may be implemented in formation of a connection or attachment of a surface to another surface by formation of a continuous inter-diffusion layer from one of the surfaces to an insert and another continuous inter-diffusion layer from that insert to the other surface as shown in FIGS. 2A, 2B, and 2C.

FIGS. 2A, 2B, and 2C illustrates a cross section, showing formation of a connection or attachment of a surface to another surface by formation of a continuous inter-diffusion layer from one of the surfaces to an insert and another continuous inter-diffusion layer from that insert to the other surface.

Method 100 may begin at starting block 109 and proceed to stage 110, where an insert layer is selected. An object 201, such as, for example, an electronic component with a mating surface 202, is a subject of attachment or establishment of a connection to object 203, which may be an electronic substrate, with mating surface 204. In this case, inserts 206 are represented in bars with rectangular cross sections with mating surfaces 205, which may have any shapes and sizes depending on the application and instruments. The inserts may be placed in between the mating surfaces 202 and 204.

From stage 110, where the insert layer is selected, method 100 may proceed to stage 120, where the insert layer and filler material may be placed between objects to be attached. The space formed by the separation between the mating surfaces 202 and 204, while the inserts are there, may be filled with a material 207, as shown in FIG. 2B, preferentially a bonding material.

From stage 120, where the insert layer and filler material are placed between the objects to be attached, method 100 may proceed to stage 130, where the materials may be inter-diffused. Inter-diffusion of the material 207 with mating surfaces 202, 204, and 205 may form two continuous inter-diffusion layers 208 along the mating surfaces 205 to the mating surfaces 202 and 204 and also can be continuous inter-diffusion layer in between the gap formed from the mating surfaces 205 with the mating surfaces 202 and/or 204. In addition, the inserts can be connected to each other before or after formation of the inter-diffusion layer for further stability. Such continuous layer may form an interconnection, joint or attachment of object 201 and object 203 to inserts 206, which then would mean the objects 201 and 203 are attached together. This inter-diffusion may attract the filler materials 207 into the gap between the mating surfaces of 205 and 202 as well as gap between mating surfaces 205 and 204. The inter-diffusion mechanism may depend on the application, such as, for example, thermal diffusion for high temperature applications. As an example this inter-diffusion layer may be formed by a chemical reaction and, for example, form an intermetallic compound or without chemical reaction and, for example, form a miscible mixture of materials 207 and materials on the mating surfaces 202, 204 and 205. The continuous inter-diffusion layer may also be a mixture of intermetallic compounds with miscible mixtures.

If the desired bond properties between the two objects are reached, method 100 may end at stage 150. Alternatively, the materials may be modified to produce the desired bond properties. Modifications to the materials and diffusion methods may be varied as discussed above to achieve desired bond properties.

Figure 3A:
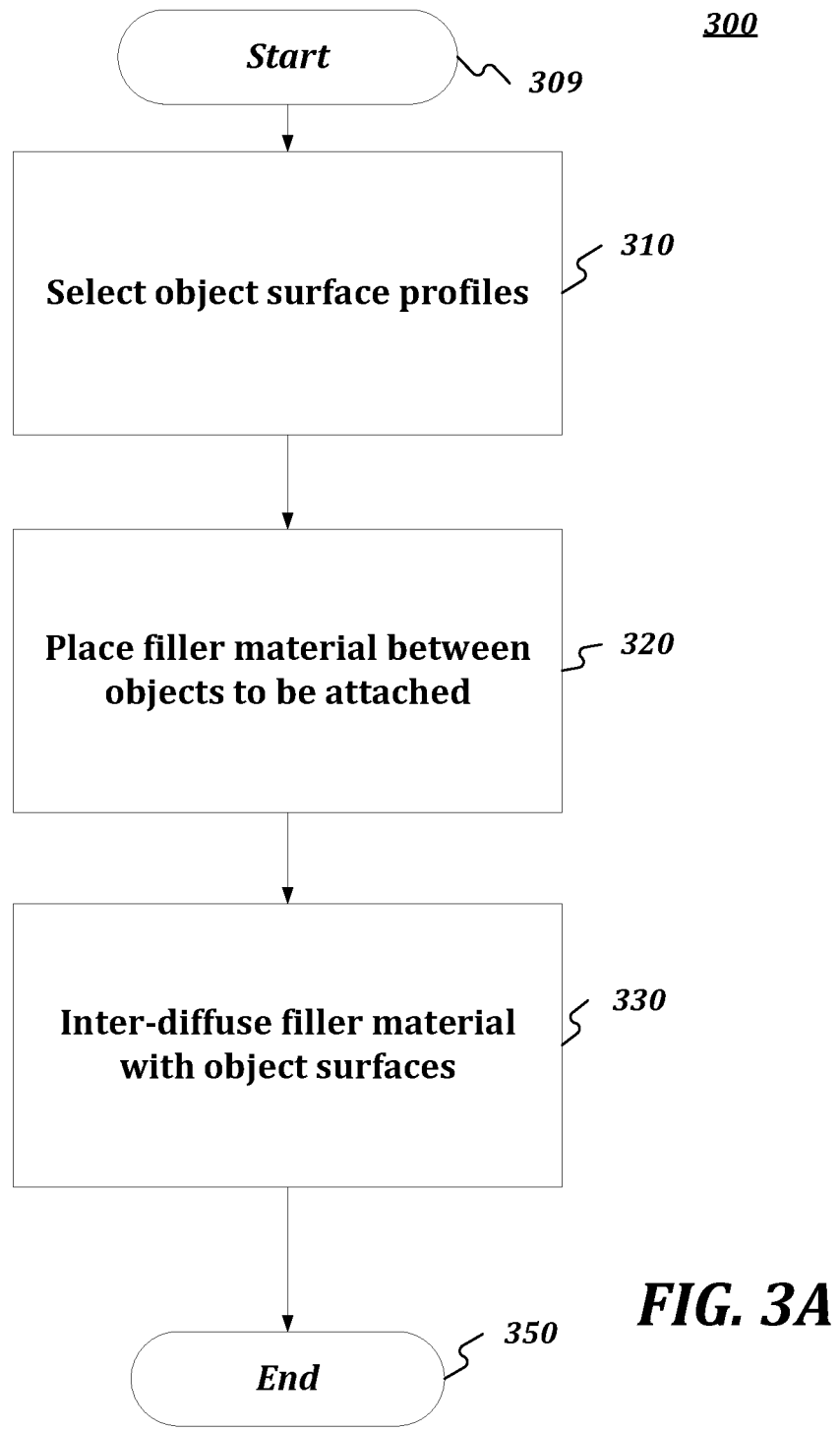
FIG. 3A illustrates a method for formation of a connection or attachment by diffusion of a material inside a gap between the two surfaces, which is formed by continuous inter-diffusion layer inside the gap from one of the surface to the other surface.

FIG. 3A is a flow chart setting forth the general stages involved in a method 300 consistent with an embodiment of the disclosure for providing a thermally resistant connection for high temperature die attachments. Method 300 illustrates a method for forming a connection or attachment by diffusion of a material inside a gap between the two surfaces, which may be formed by continuous inter-diffusion layer inside the gap from one of the surface to the other surface.

FIGS. 3B, and 3C illustrate a cross section, showing formation of a connection or attachment by diffusion of a material inside a gap between the two surfaces, which is formed by continuous inter-diffusion layer inside the gap from one of the surface to the other surface.

Method 300 may begin at starting block 309 and proceed to stage 310, where object surface profiles may be selected. An object 301, which can be an electronic component, with a mating surface 302 is the subject of attachment or establishment of a connection to object 303, which can be an electronic substrate, with mating surface 304. Structures 305 on the objects 301 and 303 as shown in FIG. 3B with rectangular cross sections, may have any shapes and sizes depending on the application and instruments and may or may not be symmetric or similar. The structures 305 can also only be on one of the objects 301 or 303. The various surface profiles may be deposited, patterned or milled out of objects 301 and/or 303.

From stage 310, where object surface profiles may be selected, method 300 may proceed to stage 320, where filler material may be placed between the objects to be attached. The space formed by the separation between the structures 305 and the mating surfaces 302 and 304 may be filled with a material 306, preferentially a bonding material.

From stage 320, where filler material is placed between the objects to be attached, method 300 may proceed to stage 330, where the materials may be inter diffused. Inter-diffusion of the material 306 with at least one of the mating surfaces 302 and/or 304 may form a continuous inter-diffusion layer 308 forming interconnection, joint or attachment of object 301 to object 303. This inter-diffusion may attract the materials inside the gap 307 between the mating surfaces of 302 and 304 and improve the attachment. There also can be no gap 307 between the mating surfaces 302 and 304 and the inter-diffusion layer may be continuous from the edges of the structures 305 on both objects 301 and 303 for establishment of the joint, attachment or interconnection of the objects 301 and 303 by inter-diffusion among materials 306 and mating surfaces 302 and 304. The inter-diffusion mechanism may depend on the application, such as, for example, thermal diffusion for high temperature electronic applications. As an example this inter-diffusion layer can be formed by a chemical reaction and, for example, form an intermetallic compound or without chemical reaction and, for example, form a miscible mixture of materials 306 and materials on the mating surfaces 302 and 304. The continuous inter-diffusion layer may also be a mixture of intermetallic compounds with miscible mixtures.

If the desired bond properties are achieved, method 300 may end at stage 350. Alternatively, the materials may be modified to produce the desired result. Modifications to the materials and diffusion methods may be varied as discussed above to achieve desired bond properties.

Various elements may be used in conjunction with embodiments of the present disclosure. The elements include, but are not limited to, for example, Cu, Ag, Au, Al, Pt, Ti, Tw, Ni, Ta, Pd, Sn, Zn, Pb (only for special applications), Sb, Bi, Cd, Si, Ge, and In.

Any of the 102, 104, 105, 107, 202, 204, 205, 207, 302, 304, and 306 may be made from them, any combinations or alloys of them, or be made out of their oxides.

The whole inserts 106 and 206, and structures 305 can also be involved into the diffusion and be part of the inter-diffusion layers 108, 208, and 308. In addition, inserts 106 and 206 may be connected or attached together inside or outside the separation between objects 101 and 103 in case of inserts 106 or separation between objects 201 and 203 in case of inserts 206. These connections of inserts may achieve improved mechanical properties and stability and support for other inserts and consequently improved mechanical stability of the inter-diffusion layers 108 and 208 in order.

Any of the materials 107, 207, and 306 could have been pre-deposited, milled or patterned on any of the objects subject of being attached or connected.

Figure 4A:
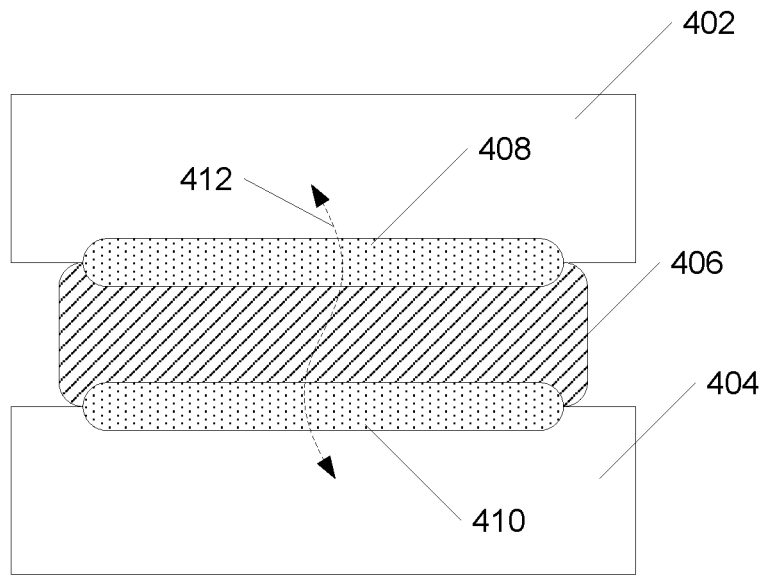
FIG. 4A illustrates a cross-section showing formation of a plurality of inter-diffusion layers as a result of performing a method of creating a bond between a first object and second object according to some embodiments.
Figure 4B:
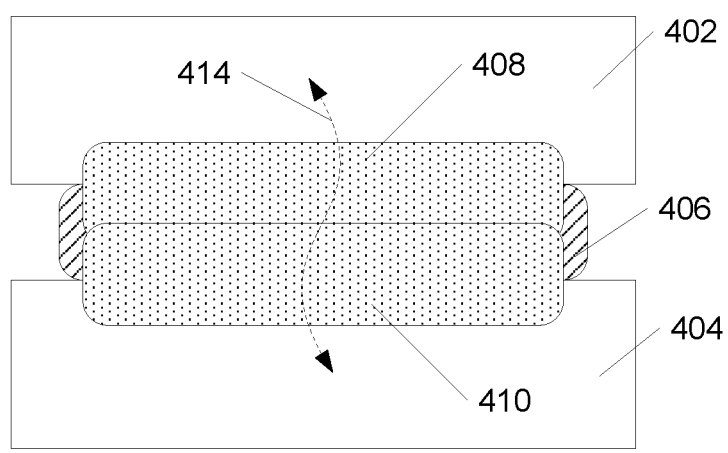
FIG. 4B illustrates a cross-section showing formation of a contiguous plurality of inter-diffusion layers as a result of performing a method of creating a bond between a first object and second object according to some embodiments.
Figure 11:
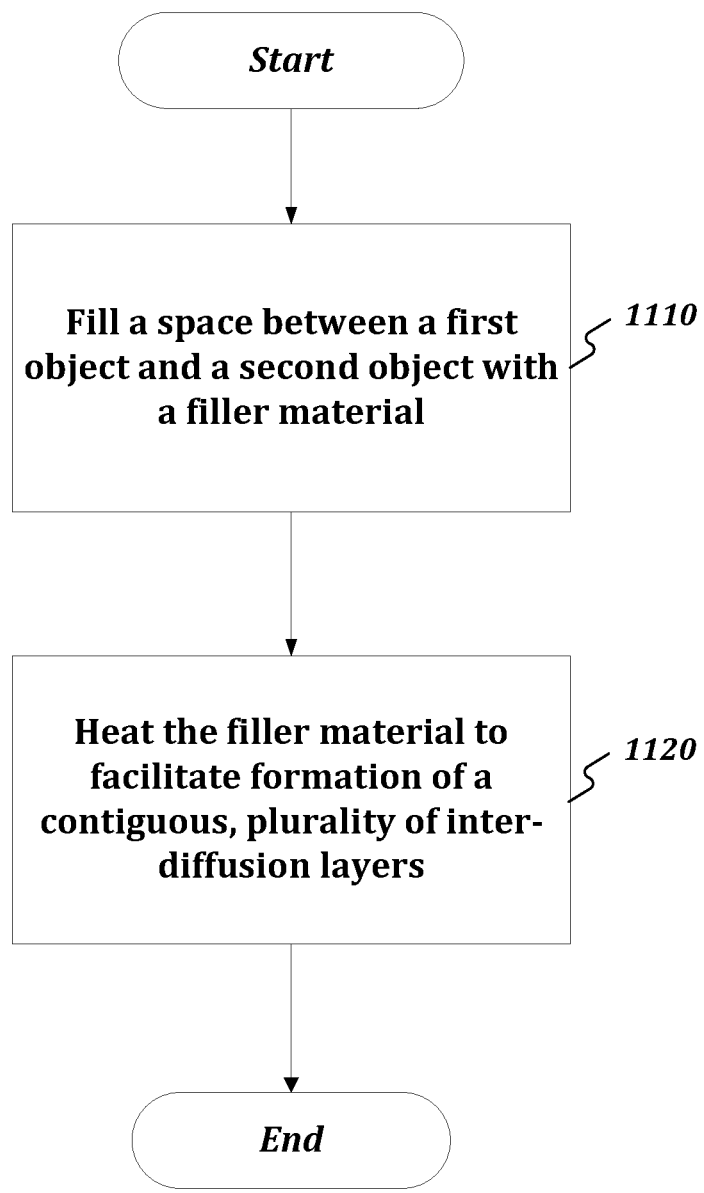
FIG. 11 illustrates a method of creating a bond between a first object and a second object in accordance with some embodiments.

Further, the present disclosure also provides a method 1100, as illustrated in FIG. 11, of creating a bond between a first object 402 and a second object 404 as illustrated in FIG. 4A and FIG. 4B. Further, in some embodiments, the first object 402 may be comprised in a substrate, such as for example, a semiconductor substrate. Accordingly, the second object 404 may be comprised in a semiconductor die. Further, the bond may facilitate attaching of the semiconductor die to the substrate.

In some embodiments, the first object 402 and/or the second object 404 may include one or more metals, such as, but not limited to, Cu, Ag, Au, Al, Pt, Ti, Tw, Ni, Ta, Pd, Sn, Zn, Pb (only for special applications), Sb, Bi, Cd, Si, Ge, and In. For instance, in some embodiments, each of the first object 402 and the second object 404 may include at least one metal, such as Gold (Au).

The method 1100 may include a step 1110 of filling a space between the first object 402 and the second object 404 with a filler material 406. Further, in some embodiments, the filler material 406 may be a bonding material. For instance, the filler material 406 may include sintered silver nanoparticles.

Further, the method 1100 may include a step 1120 of heating the filler material 406 to facilitate formation of a plurality of inter-diffusion layers. Heating of the filler material 406 may be performed by directly heating the filler material 406. Alternatively and/or additionally, one or more of the first object 402 and the second object 404 may be heated while the filler material 406 may receive heat through thermal conduction.

Further, in some embodiments, the heating may be performed to a temperature below a melting point of each of the first object 402, the second object 404, the filler material 406 and the at least one insert 502.

Due to the heating, a first inter-diffusion layer 408 may be formed between the filler material 406 and the first object 402. Further, a second inter-diffusion layer 410 may be formed between the filler material 406 and the second object 404. The plurality of inter-diffusion layers may provide a physical bond between the first object 402 and the second object 404. Further, in some embodiments, the plurality of inter-diffusion layers may provide at least one of a thermal conduction and electrical conduction between the first object 402 and the second object 404.

In some embodiments, the method 1100 may further include applying external pressure to at least one of the first object 402 and the second object 404 to further facilitate formation of the plurality of inter-diffusion layers. Accordingly, in some embodiments, the plurality of inter-diffusion layers may be formed under atmospheric pressure.

As a result of formation of the plurality of inter-diffusion layers, as illustrated in FIG. 4A, a path 412 for thermal and/or electrical conduction may be formed between the first object 402 and the second object 404. The path may begin from the first object 402, and pass through each of the first inter-diffusion layer 408, the filler material 406 and the second inter-diffusion layer 410 and finally end in the second object 404. Further, due to the material characteristics of the first inter-diffusion layer 408 and the second inter-diffusion layer 410, the path 412 may be characterized by enhanced thermal and/or electrical conduction. For instance, thermal, mechanical and/or electrical characteristics associated with the bond between the first object 402 and the second object 404 may remain within an effective range even in the presence of extreme environments, such as high temperature, high pressure etc.

Furthermore, in some embodiments, the first inter-diffusion layer 408 may be contiguous with the second inter-diffusion layer 410 as illustrated in FIG. 4B. For example, when the spacing between the first object 402 and the second object 404 is reduced, the first inter-diffusion layer 408 may overlap with the second inter-diffusion layer 410. Alternatively and/or additionally, the material characteristics or quantity of the first object 402, the filler material 406 and the second object 404 may be such that an extent of inter-diffusion may be large enough to result in an overlap of the inter-diffusion layer 408 with the inter-diffusion layer 410.

Accordingly, a path 414 for thermal and/or electrical conduction may be formed. The path may begin from the first object 402, and pass through each of the first inter-diffusion layer 408 and the second inter-diffusion layer 410 and finally end in the second object 404. In some embodiments, contiguity of the first inter-diffusion layer 408 with the second inter-diffusion layer 410 may further enhance mechanical, thermal and/or electrical characteristics of the bond between the first object 402 and the second object 404.

Figure 5A:
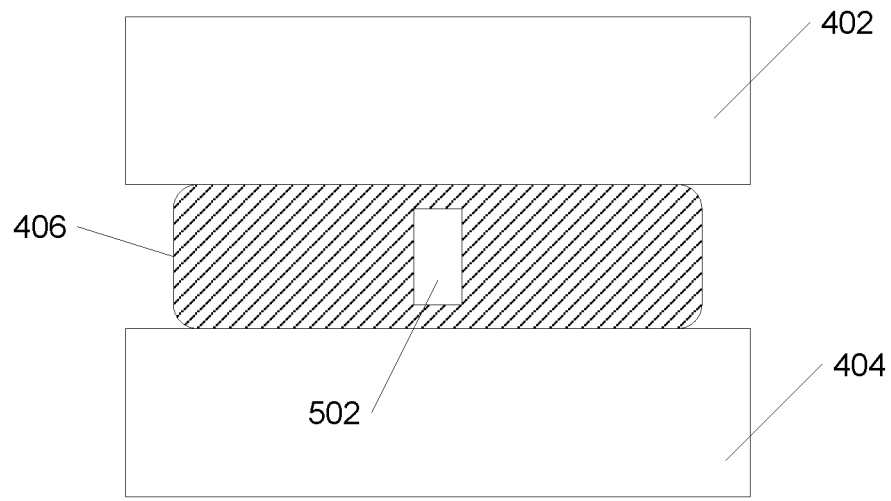
FIG. 5A illustrates a cross-section of a placement of a first object, a second object, a filler material and an insert in order to create a bond between the first object and the second object in accordance with some embodiments.

Further, in some embodiments, a space between the first object 402 and the second object 404 may include at least one insert 502 as illustrated in FIG. 5A. Accordingly, in some embodiments, the method 1100 may further include placing the at least one insert 502 in the space.

Figure 9A:
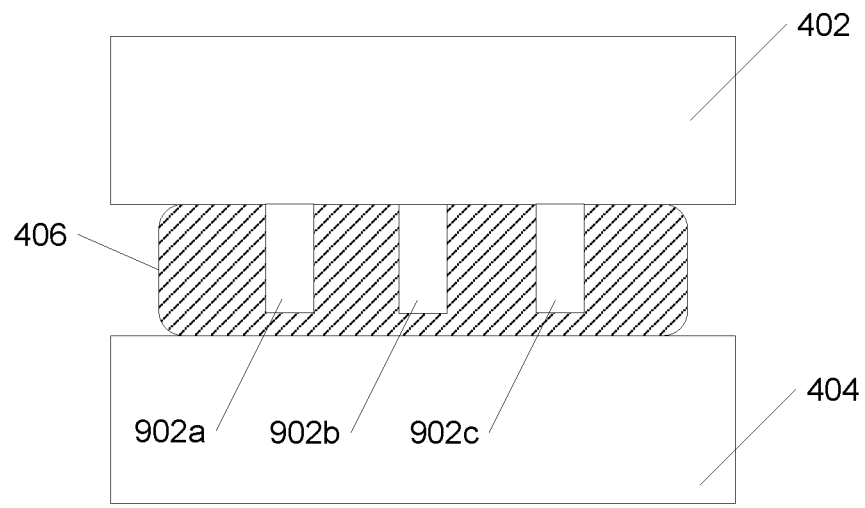
FIG. 9A illustrates a cross-section of a placement of a first object, a second object, a filler material and a plurality of inserts formed on the first object in order to create a bond between the first object and the second object in accordance with some embodiments.

Further, in some embodiments, the at least one insert 502 may be comprised in at least one of the first object 402 and the second object 404 as exemplarily illustrated in FIG. 9A, where the at least insert 502 may include inserts 902a-902c. Accordingly, the method 1100 may further include a step of forming the at least one insert 502 on at least one of the first object 402 and the second object 404. The forming of the at least one insert 502 may be performed using techniques such as etching, depositing, milling, patterning and so on.

Further, the at least one insert 502 may be in physical contact with the filler material 406. In some embodiments, the at least one insert 502 may include an insert layer. Further, in some embodiments, the insert layer may include a mesh screen.

Additionally, as result of heating, a third inter-diffusion layer 504 may be formed between the at least one insert 502 and the filler material 406. Further, the third inter-diffusion layer 504 may be contiguous with each of the first inter-diffusion layer 408 and the second inter-diffusion layer 410.

Figure 5B:
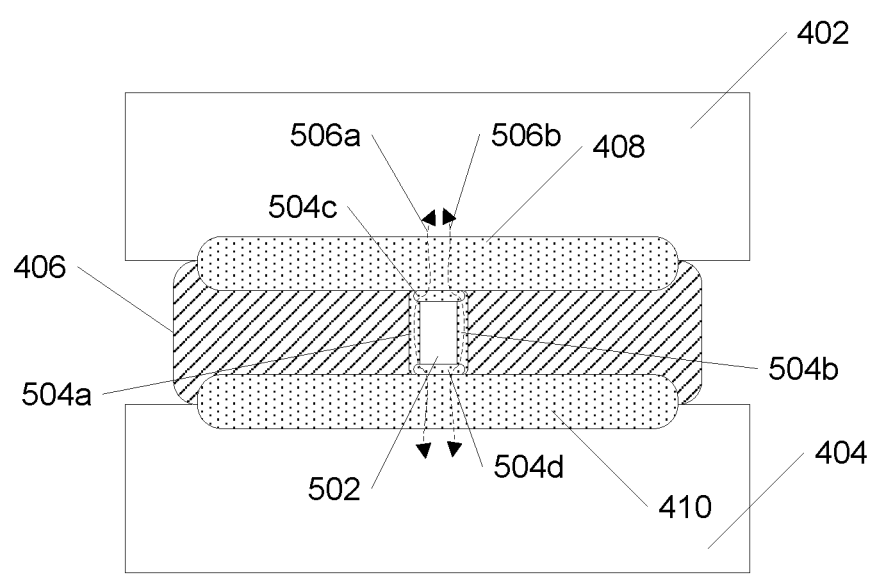
FIG. 5B illustrates a cross-section showing a contiguous plurality of inter-diffusion layers that provides a bond between the first object and the second object using the insert in accordance with some embodiments.

For example, due to placement of the at least one insert 502 as shown in FIG. 5A, the third inter-diffusion layer 504 may include inter-diffusion layers 504a to 504d surrounding the at least one insert 502 as shown in FIG. 5B. Further, as shown, inter-diffusion layer 504c may be contiguous with the first inter-diffusion layer 408. Similarly, inter-diffusion layer 504d may be contiguous with the second inter-diffusion layer 410. Further, inter-diffusion layer 504c may be contiguous with inter-diffusion layer 504d through each of inter-diffusion layer 504a and 504b. Accordingly, paths of thermal and/or electrical conduction such as path 506a and 506b may be formed.

Figure 5C:
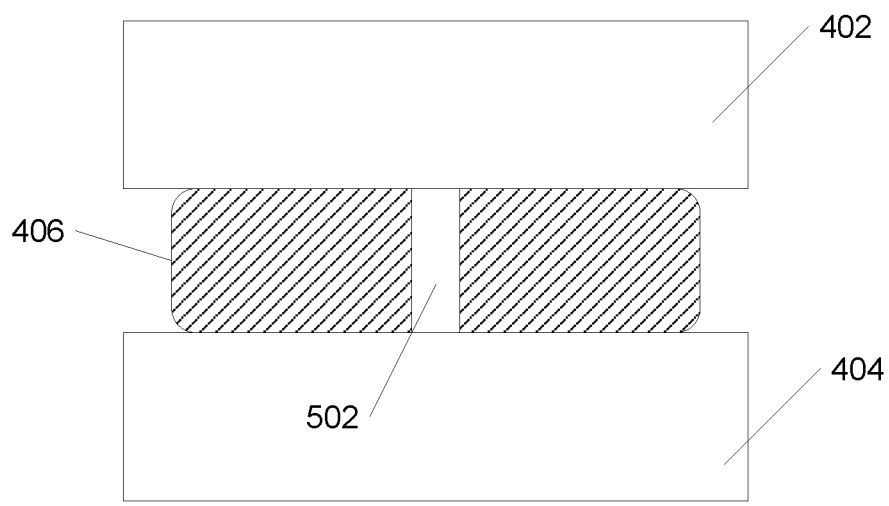
FIG. 5C illustrates a cross-section of a placement of a first object, a second object, a filler material and an insert in physical contact with the first object and the second object in order to create a bond between the first object and the second object in accordance with some embodiments.
Figure 5D:
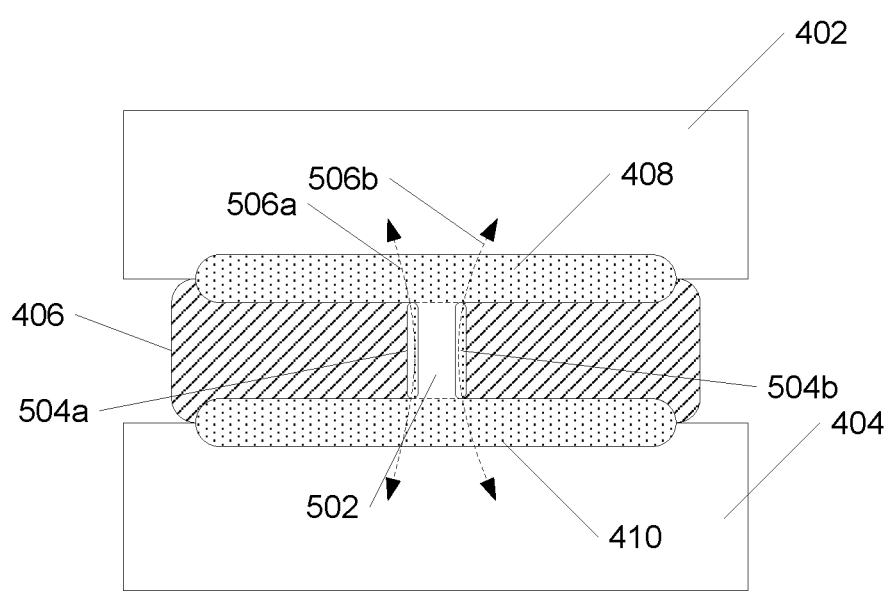
FIG. 5D illustrates a cross-section showing a contiguous plurality of inter-diffusion layers that provides a bond between the first object and the second object in accordance with some embodiments.

Alternatively, in some embodiments, the at least one insert 502 may be placed as illustrated in FIG. 5C, where the at least one insert 502 may be in physical contact with each of the first object 402 and the second object 404. Accordingly, as a result of the heating, the plurality of inter-diffusion layers 504a and 504b as illustrated in FIG. 5D may be formed.

Further, in some embodiments, at least one of the first object 402, the second object 404, the at least one insert 502 and the filler material 406 may include at least one of grain boundaries and twin boundaries which may facilitate formation of the plurality of inter-diffusion layers. For instance, the filler material 406 such as sintered silver may include many grain boundaries and twin boundaries which may enhance the diffusion of gold atoms into sintered silver and allow for fast formation of the plurality of inter-diffusion layers. Additionally, in some instances, the presence of grain boundaries and twin boundaries may facilitate formation of the plurality of inter-diffusion layers without necessarily applying external pressure. Accordingly, the first object 402 and the second object 404 may be bonded under atmospheric pressure.

Figure 6A:
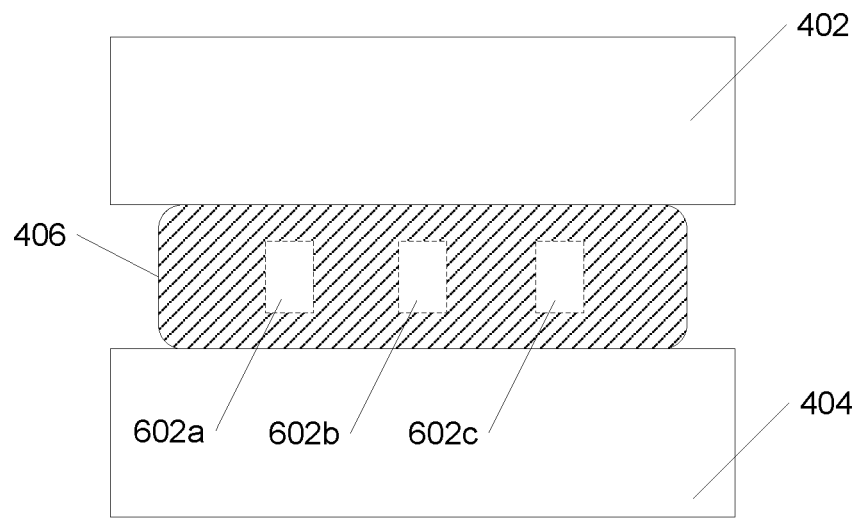
FIG. 6A illustrates a cross-section of a placement of a first object, a second object, a filler material and a plurality of widely spaced inserts in order to create a bond between the first object and the second object in accordance with some embodiments.
Figure 6B:
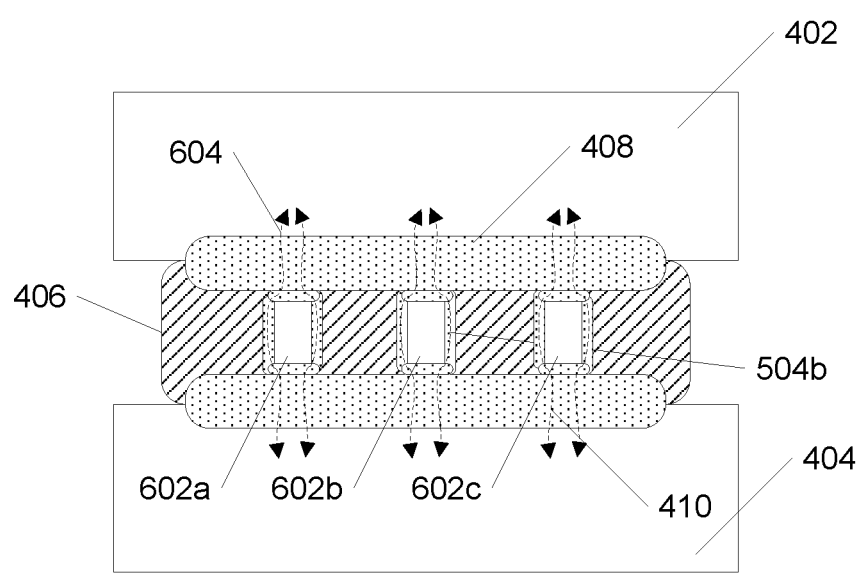
FIG. 6B illustrates a cross-section showing a contiguous plurality of inter-diffusion layers that provides a bond between the first object and the second object using the plurality of widely spaced inserts in accordance with some embodiments.

Further, in some embodiments, as illustrated in FIG. 6A, the at least one insert 502 may include a plurality of inserts 602a to 602c. The plurality of inserts, in some instances may be individual members. Alternatively, in some instances, the plurality of inserts 602a to 602c may be physically connected to each other, for example, in the form of a mesh screen. Accordingly, due to the heating, the plurality of inter-diffusion layers as illustrated in FIG. 6B may be formed.

Further, a spacing of the plurality of inserts 602a to 602c may be such that, the inter-diffusion layers formed around the inserts 602a to 602c may not be physically contiguous. For instance, the inter-diffusion layer formed around the insert 602a may not be physically contiguous with the inter-diffusion layer formed either around 602b or 602c. As a result, paths 604 for thermal and/or electrical conduction may be formed between the first object 402 and the second object 404.

Figure 6C:
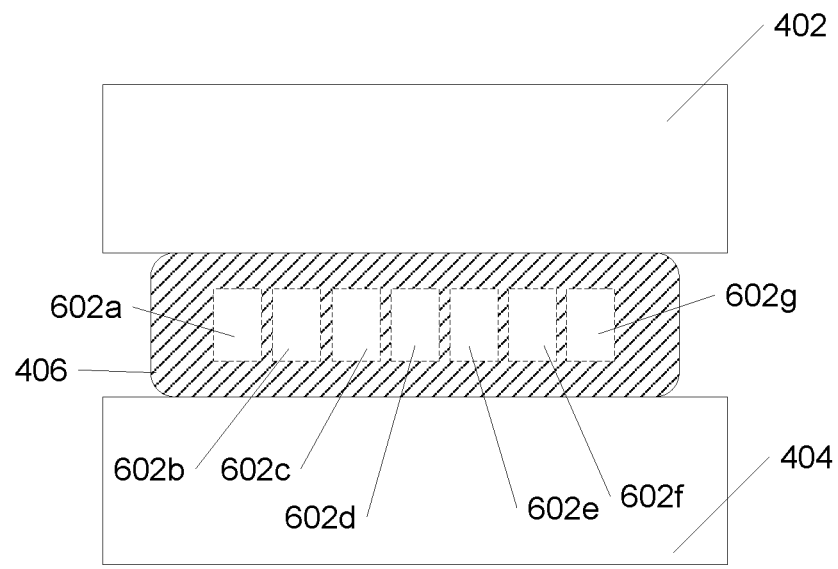
FIG. 6C illustrates a cross-section of a placement of a first object, a second object, a filler material and a plurality of closely spaced inserts in order to create a bond between the first object and the second object in accordance with some embodiments.
Figure 6D:
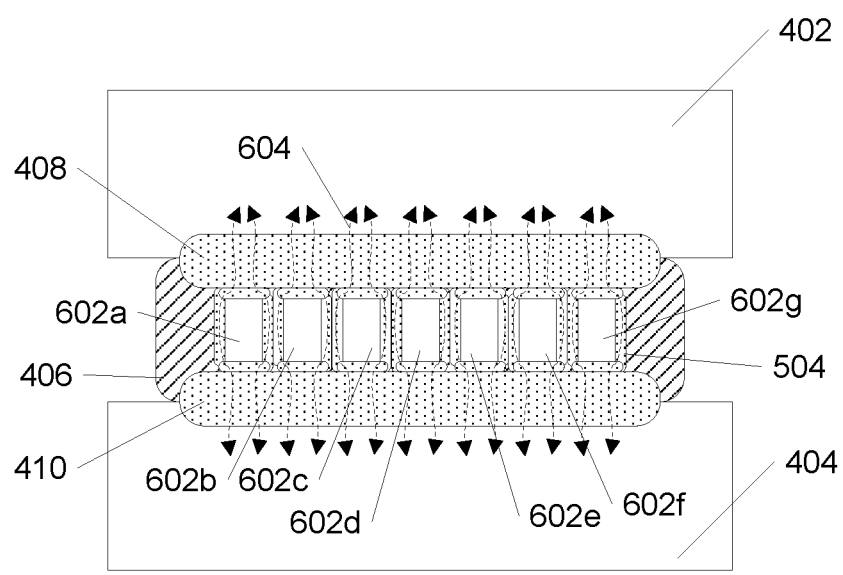
FIG. 6D illustrates a cross-section showing a contiguous plurality of inter-diffusion layers that provides a bond between the first object and the second object using the plurality of closely spaced inserts in accordance with some embodiments.

However, in some embodiments, as illustrated in FIG. 6C, a spacing of the plurality of inserts 602a to 602g may be such that, the inter-diffusion layers formed around the inserts 602a to 602g may be physically contiguous. For instance, the inter-diffusion layer formed around the insert 602a may be physically contiguous with the inter-diffusion layer formed either around 602b. As a result, paths 604 for thermal and/or electrical conduction may be formed between the first object 402 and the second object 404. Further, the paths 604 may pass through the contiguous, plurality of inter-diffusion layers formed around the plurality of inserts 602a-g.

Further, in some embodiments, each of the first object 402, the second object 404 and the at least one insert 502 may include of a metal, such as Gold. Additionally, the plurality of inter-diffusion layers, such as for example, inter-diffusion layers 504a-d in FIG. 5, may be homogeneous.

Figure 7A:
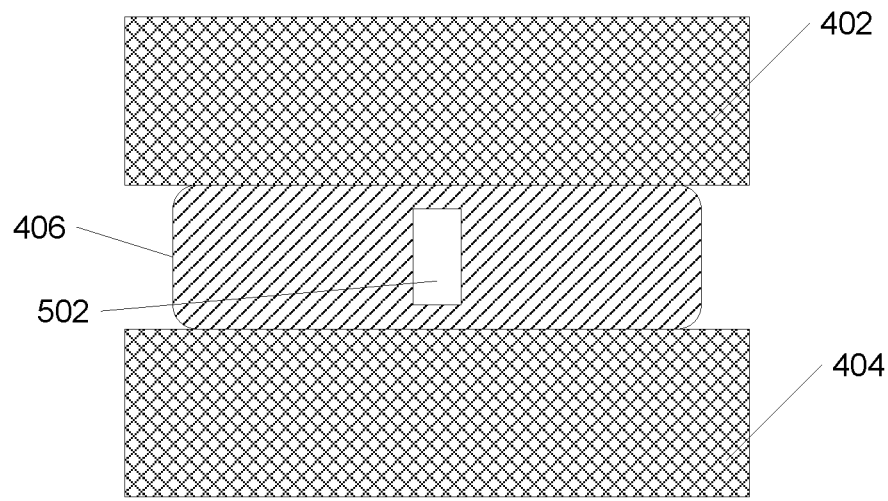
FIG. 7A illustrates a cross-section of a placement of a first object and a second object made of one metal and an insert made of another metal in order to create a bond between the first object and the second object in accordance with some embodiments.
Figure 7B:
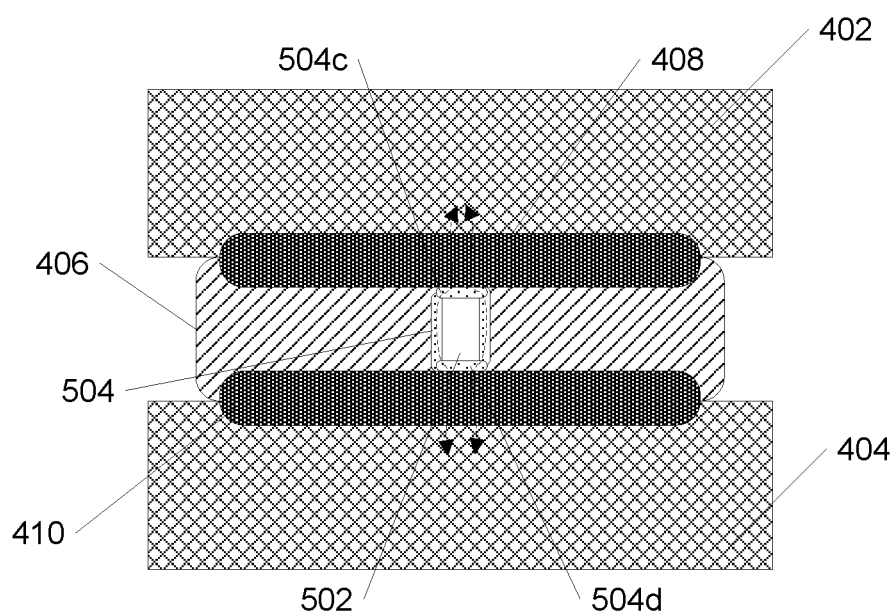
FIG. 7B illustrates a cross-section showing a contiguous, heterogeneous plurality of inter-diffusion layers that provides a bond between the first object and the second object in accordance with some embodiments.

Further, in some embodiments, as illustrated in FIG. 7A, each of the first object 402 and the second object 404 comprise a first metal, such as, for example, Copper. Whereas, the at least one insert 502 may include a second metal, such as, for example, Gold. Accordingly, the plurality of inter-diffusion layers, such as inter-diffusion layers 408, 504 and 410 as illustrated in FIG. 7B may be heterogeneous.

Figure 7C:
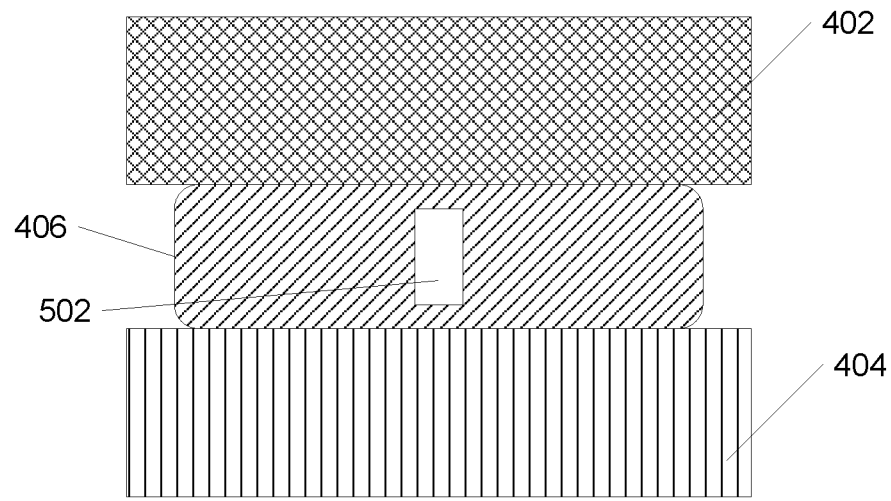
FIG. 7C illustrates a cross-section of a placement of a first object made of one metal, a second object made of another metal and an insert made of yet another metal in order to create a bond between the first object and the second object in accordance with some embodiments.
Figure 7D:
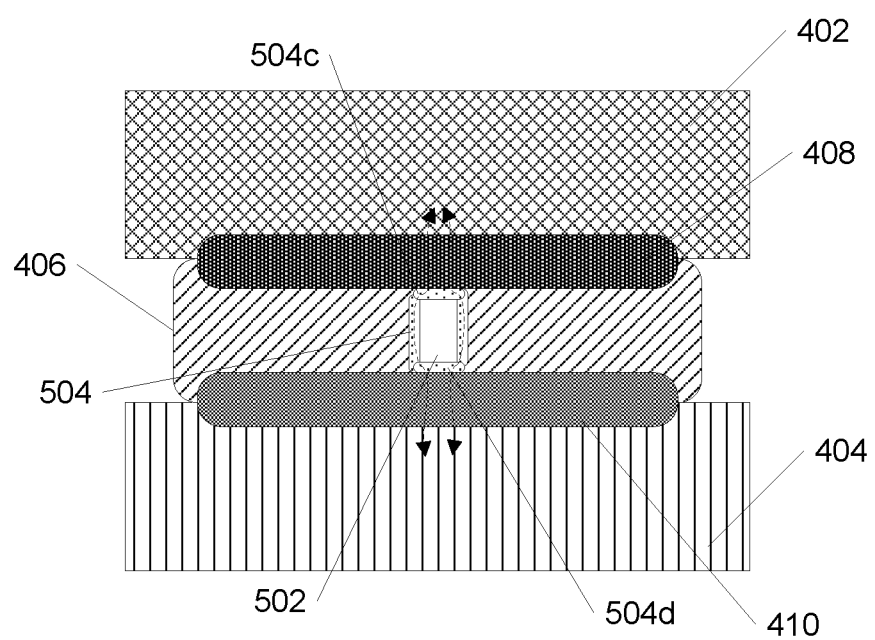
FIG. 7D illustrates a cross-section showing a contiguous, heterogeneous plurality of inter-diffusion layers that provides a bond between the first object and the second object in accordance with some embodiments.

Further, in some embodiments, as illustrated in FIG. 7C, the first object 402 may include a first metal such as Copper, the second object 404 may include a second metal such as Aluminum and the at least one insert 502 may include a third metal such as Gold. Further, the plurality of inter-diffusion layers, such as inter-diffusion layers 408, 504 and 410 as illustrated in FIG. 7D may be heterogeneous.

Further, in some embodiments, an inter-diffusion layer between the filler material 406 and an object may be formed based on diffusion of particles from the filler material 406 into the object and diffusion of particles from the object into the filler material 406. Further, the object may be one of the first object 402, the second object 404 and the at least one insert 502.

Further, in some embodiments, an inter-diffusion layer between the filler material 406 and an object may be formed based on a chemical reaction between the filler material 406 and the object. Further, the object may be one of the first object 402, the second object 404 and the at least one inserts 502.

Further, in some embodiments, an inter-diffusion layer between the filler material 406 and an object may be formed based on electro-migration between the filler material 406 and the object. Further, the object may be one of the first object 402, the second object 404 and the at least one inserts 502.

Further, in some embodiments, the at least one insert 502 may be configured to enable a gap within the at least one insert 502 or a gap in between the at least two inserts 502 to reach an edge of at least one of the first object 402 and the second object 404. Further, the gap allows vapors to travel into a space surrounding at least one of the first object 402 and the second object 404.

Figure 8A:
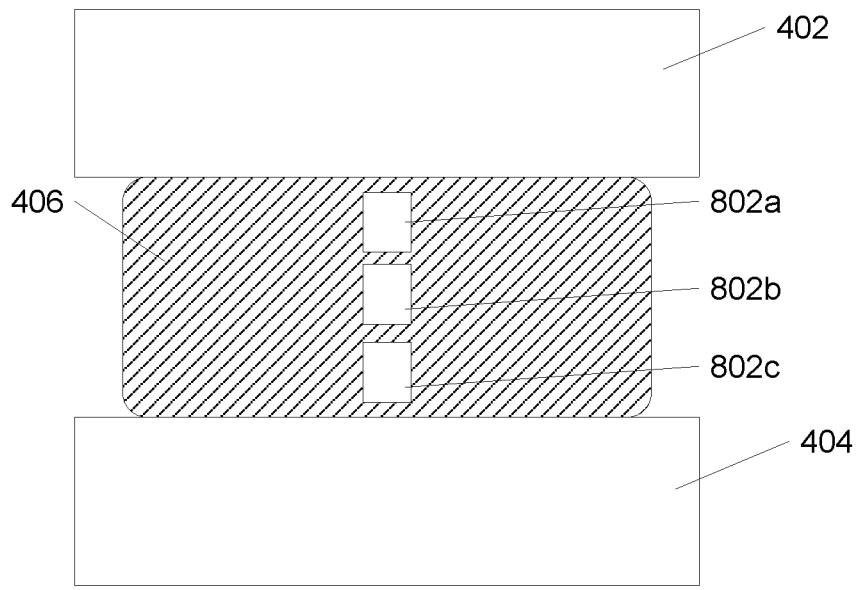
FIG. 8A illustrates a cross-section of a placement of a first object, a second object, a filler material and a plurality of inserts in order to create a bond between the first object and the second object in accordance with some embodiments.
Figure 8B:
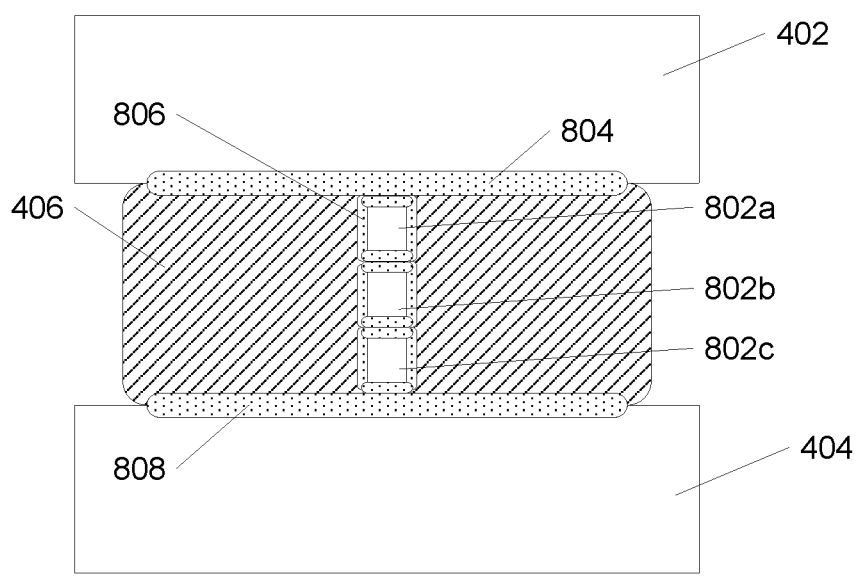
FIG. 8B illustrates a cross-section showing a contiguous plurality of inter-diffusion layers that provides a bond between the first object and the second object using the plurality of inserts in accordance with some embodiments.

Further, in some embodiments, the at least one insert 502 may include a plurality of inserts, such as inserts 802a to 802c as illustrated in FIG. 8A. Further, the plurality of inserts 802a-c span the space. Further, a first insert, such as insert 802a, may be proximal to a surface of the first object 402 and the second insert, such as insert 802c, may be proximal to a surface of the second object 404. Accordingly, due to the heating, a plurality of inter-diffusion layers 804, 806 and 808 may be formed as illustrated in FIG. 8B. Further, the plurality of inter-diffusion layers 804, 806 and 808 may facilitate thermal and/or electrical conduction between the first object 402 and the second object 404.

Figure 9B:
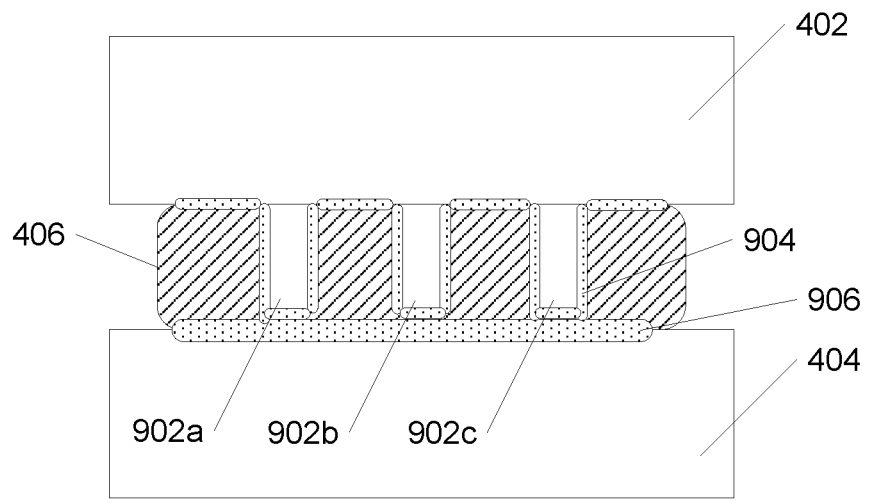
FIG. 9B illustrates a cross-section showing a contiguous plurality of inter-diffusion layers that provides a bond between the first object and the second object using the plurality of inserts formed in the first object in accordance with some embodiments.

Further, in some embodiments, the at least one insert 502 may include a plurality of inserts, such as inserts 902a to 902c as illustrated in FIG. 9A. Further, the inserts 902a-c may be included in the first object 402. Accordingly, in some instances, the inserts 902a-c may be formed on the first object 402 by one or more techniques such as etching, depositing, patterning, contouring and so on. Further, due to the heating, the plurality of inter-diffusion layers 904 and 906 may be formed as illustrated in FIG. 9B.

Figure 10A:
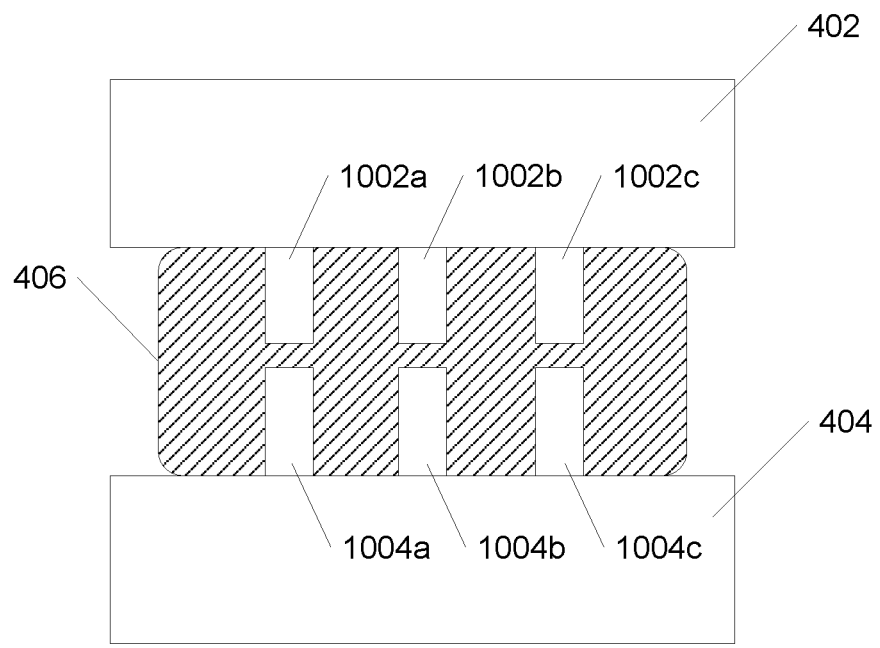
FIG. 10A illustrates a cross-section of a placement of a first object, a second object, a filler material and a plurality of inserts formed on each of the first object and the second object in order to create a bond between the first object and the second object in accordance with some embodiments.
Figure 10B:
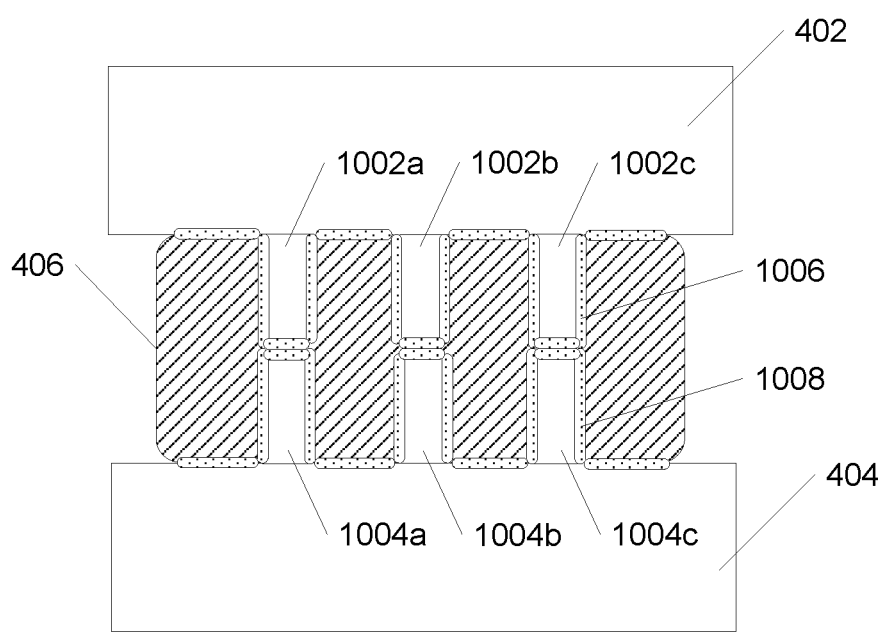
FIG. 10B illustrates a cross-section showing a contiguous plurality of inter-diffusion layers that provides a bond between the first object and the second object using the plurality of inserts formed in each of the first object and the second object in accordance with some embodiments.

Further, in some embodiments, the at least one insert 502 may include a plurality of inserts, such as inserts 1002a to 1002c and 1004a-1004c as illustrated in FIG. 10A. Further, the inserts 1002a to 1002c may be included in the first object 402. Similarly, the inserts 1004a to 1004c may be included in the second object 404. Accordingly, in some instances, the inserts 1002a to 1002c and 1004a-1004c may be formed on the first object 402 and the second object 404 respectively by one or more techniques such as etching, depositing, patterning, contouring and so on. Further, due to the heating, the plurality of contiguous inter-diffusion layers 1006 and 1008 may be formed as illustrated in FIG. 10B.

Figure 12:
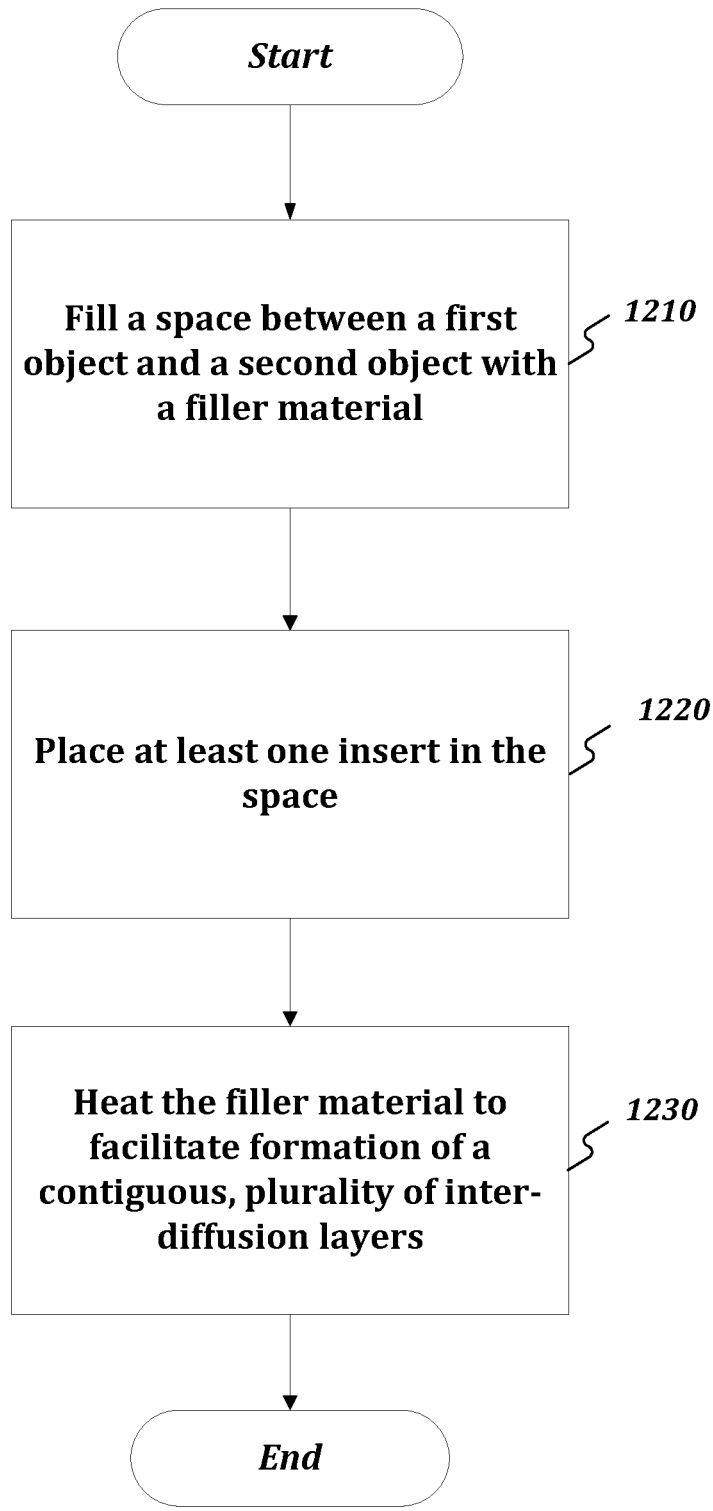
FIG. 12 illustrates a method of creating a bond between a first object and a second object involving placement of an insert in accordance with some embodiments.

Further, as illustrated in FIG. 12, a method 1200 of creating a bond between a first object 402 and a second object 404 according to some embodiments may be provided. The method 1200 may include a step 1210 of filling a space between the first object 402 and the second object 404 with the filler material 406. Further, the method 1200 may include a step 1220 of placing the at least one insert 502 in the space. Additionally, the method may include a step 1230 of heating the filler material 406 to facilitate formation of a contiguous plurality of inter-diffusion layers.

Figure 13:
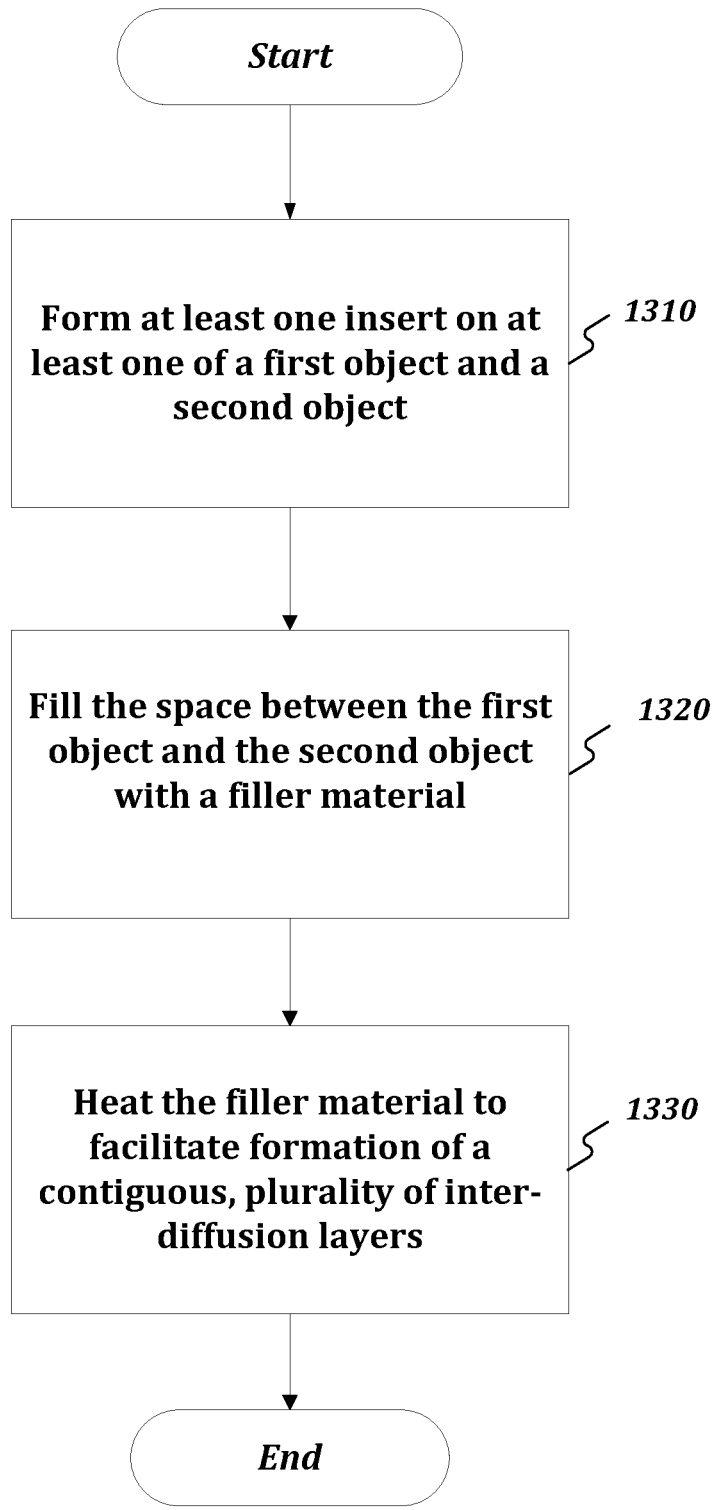
FIG. 13 illustrates a method of creating a bond between a first object and a second object involving formation of an insert on at least one of the first object and the second object in accordance with some embodiments.

Further, as illustrated in FIG. 13, a method 1300 of creating a bond between the first object 402 and the second object 404 according to some embodiments may be provided. The method 1300 may include a step 1310 of forming the at least one insert 502 on at least one of a first object 402 and a second object 404. Further, the method 1300 may include a step 1320 of filling the space between the first object 402 and the second object 404 with the filler material 406. Additionally, the method 1300 may include a step 1330 of heating the filler material 406 to facilitate formation of a contiguous, plurality of inter-diffusion layers.

Figure 14:
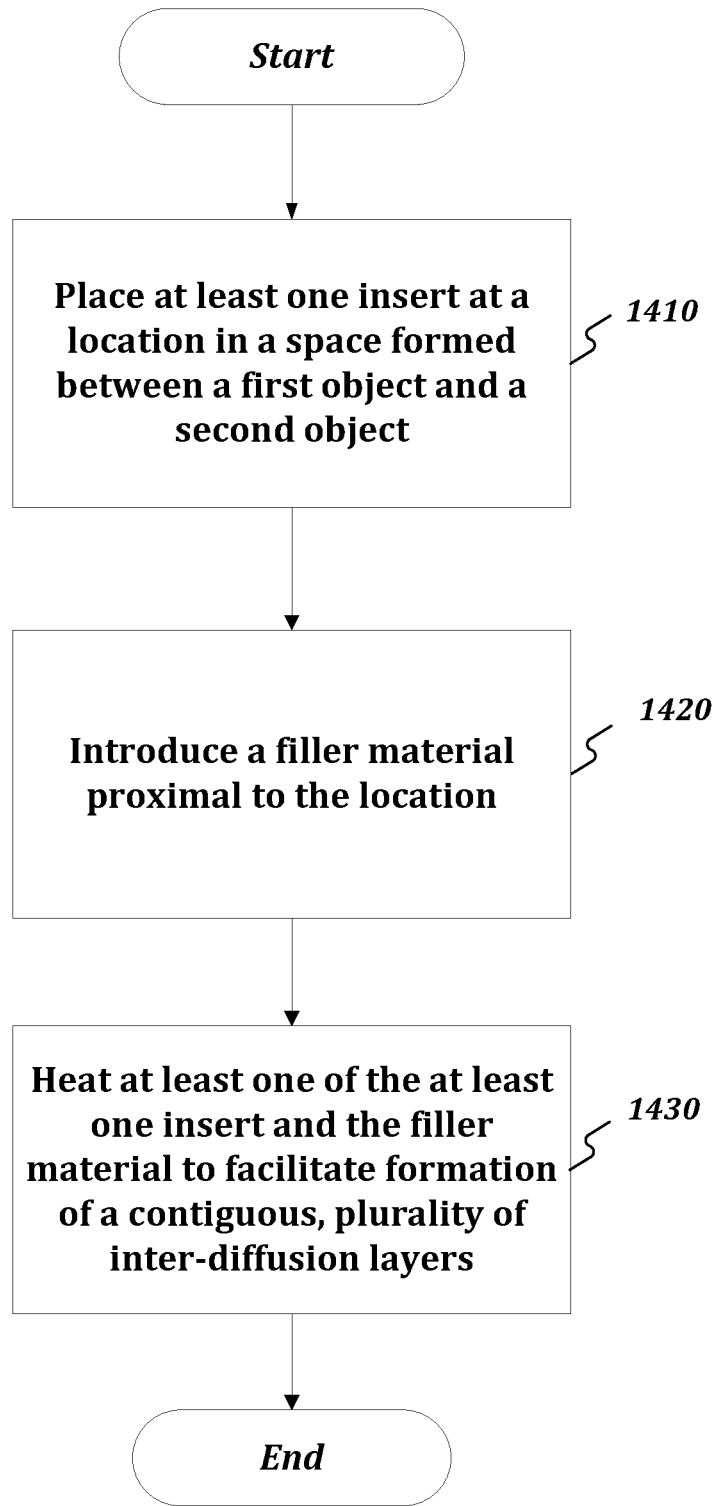
FIG. 14 illustrates a method of creating a bond between a first object and a second object involving placement of an insert and introduction of filler material in accordance with some embodiments.

Further, as illustrated in FIG. 14, a method 1400 of creating a bond between the first object 402 and the second object 404 according to some embodiments may be provided. The method 1400 may include a step 1410 of placing the at least one insert 502 at a location in a space formed between the first object 402 and the second object 404. Further, the method may include a step 1420 of introducing the filler material 406 proximal to the location. Additionally, the method may include a step 1430 of heating at least one of the at least one insert 502 and the filler material 406. Further, the heating may facilitate formation of an inter-diffusion layer. Furthermore, a first portion of the inter-diffusion layer may be formed by diffusion between the filler material 406 and the at least one insert 502. Likewise, a second portion of the inter-diffusion layer may be formed between the filler material 406 and the first object 402. Additionally, a third portion of the inter-diffusion layer may be formed between the filler material 406 and the second object 404. Further, the first portion may be contiguous with each of the second portion and third portion. As a result, the first object 402 and the second object 404 may be connected through a contiguous plurality of inter-diffusion layers.

Figure 15:
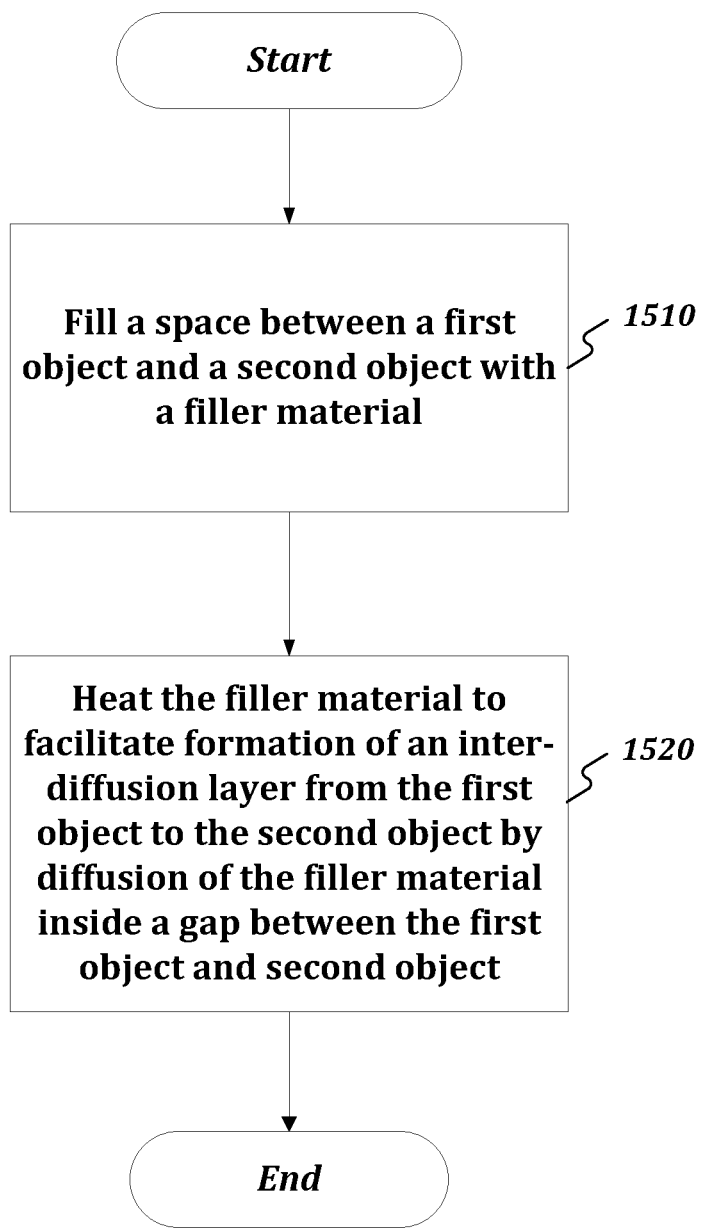
FIG. 15 illustrates a method of creating a bond between a first object and a second object in accordance with some embodiments.

Further, as illustrated in FIG. 15, a method 1500 of creating a bond between a first object 402 and a second object 404 according to some embodiments may be provided. The method 1500 may include a step of filling a space between the first object 402 and the second object 404 with the filler material 406. Additionally, the method may include a step of heating the filler material 406 to facilitate formation of an inter-diffusion layer from the first object 402 to the second object 404 by diffusion of the filler material 406 inside a gap between the first object 402 and second object 404.

Further, a method of creating a bond between a first object 402 and a second object 404 according to some embodiments is provided. The method may include a step of filling a space between the first object 402 and the second object 404 with a filler material 406. Additionally, the method may include a step of heating the filler material 406 to facilitate formation a plurality of inter-diffusion layers. Further, a first inter-diffusion layer 408 may be formed between the filler material 406 and the first object 402. Further, a second inter-diffusion layer 410 may be formed between the filler material 406 and the second object 404.

Further, in some embodiments, a semiconductor device formed based on one or more methods of the present disclosure is also provided. The semiconductor device may include a semiconductor die and a substrate. Further, the semiconductor die may be attached to the substrate based on a bond formed between a first object 402 comprised in the semiconductor die and second object 404 comprised in the substrate. Further, the bond may be created by a step of filling a space between the first object 402 and the second object 404 with a filler material 406. Additionally, a step of heating the filler material 406 to facilitate formation a plurality of inter-diffusion layers may be performed. Further, a first inter-diffusion layer 408 may be formed between the filler material 406 and the first object 402. Further, a second inter-diffusion layer 410 may be formed between the filler material 406 and the second object 404. Further, the first inter-diffusion layer 408 may be contiguous with the second inter-diffusion layer 410.

Further, in some embodiments, an electronic module formed based on methods of the present disclosure is also provided. The electronic module may include a substrate and at least one chip. Further, a first set of inserts may be placed inside a space between the substrate and the at least one chip. Further, a second set of inserts may be placed inside a space formed by the substrate, the at least one chip and the first set of inserts. Further, diffusion of the second set of inserts occurs into at least one of a space between the substrate's mating surface and the at least one chip's mating surface, a gap between the first set of the inserts and the substrate and a gap between the first set of inserts and the at least one chip. Further, the diffusion may result in formation of at least one of a continuous diffusion layer from the substrate to the at least one chip and a continuous diffusion layer from the first set of the inserts to the substrate and a continuous diffusion layer from the first set of the inserts to the at least one chip.

The depicted embodiments in the figures are used as examples only. For example, in some embodiments, the vertical inter-diffusion layers may be connected directly to the first object and the second object. In other embodiments, the vertical inter-diffusion layers may only be connected to the first object and the second via the horizontal inter-diffusion layers. It should be understood that, while all variations are possible, the direct connection of the vertical inter-diffusion layers and the first and second objects are preferred.

The thermal and/or electrical conduction paths are not limited to the paths shown in figures and also they may also work in the opposite way, for example, by insulating or reducing electrical and/or thermal conduction.

Any combination of any of the eight methods above or all of them together can also be used to produce an interconnection, joint or attachment. Moreover, modifications to the methods above may be possible to product the interconnection without deviating from the spirit and scope of the present disclosure.

IV. Claims

While the specification includes examples, the disclosure's scope is indicated by the following claims. Furthermore, while the specification has been described in language specific to structural features and/or methodological acts, the claims are not limited to the features or acts described above. Rather, the specific features and acts described above are disclosed as example for embodiments of the disclosure.

Insofar as the description above and the accompanying drawing disclose any additional subject matter that is not within the scope of the claims below, the disclosures are not dedicated to the public and the right to file one or more applications to claims such additional disclosures is reserved.

I claim the following:

1. A method of forming a coadunate interdiffusion layer amongst a first object, a second object, and at least one insert feature, the method comprising:

disposing an insert assembly in a space formed between the first object and the second object,
wherein the insert assembly comprises the at least one insert feature and a filler material; and
forming the coadunate interdiffusion layer,
wherein forming the coadunate interdiffusion layer comprises heating the first object, the second object, and the insert assembly to a processing temperature to form a first interdiffusion portion between the first object and the filler material, a second interdiffusion portion between the second object and the filler material, and a third interdiffusion portion between the at least one insert feature and the filler material,
wherein the heating is performed to form the coadunate interdiffusion layer with an unbroken contiguity among the first interdiffusion portion, the second interdiffusion portion and the third interdiffusion portion, and
wherein the processing temperature is lower than a lowest melting temperature among melting temperatures of the first object, the second object, the insert feature, and the filler material.

2. The method of claim 1, wherein forming the coadunate interdiffusion layer comprises applying a minimum processing pressure of zero.

3. The method of claim 1, wherein the at least one insert feature comprises a mesh structure.

4. The method of claim 1, wherein the at least one insert feature comprises a columnar structure.

5. The method of claim 1, wherein the at least one insert feature comprises a plurality of volumetrically dispersed insert features.

6. The method of claim 1, wherein the filler material comprises nanoparticulate silver, further wherein at least one of the at least one insert feature comprises gold.

7. The method of claim 1, wherein disposing the insert assembly comprises forming at least one of the at least one insert feature integrally with at least one of the first object and the second object.

8. The method of claim 1, wherein disposing the insert assembly is preceded by subjecting the insert assembly to a sintering process.

9. The method of claim 1, wherein forming the coadunate interdiffusion layer comprises forming the third interdiffusion layer, the third interdiffusion layer comprising an interdiffusion of at least a portion of the filter material into the at least one insert feature.

10. A method comprising:
forming a bond between a first object and a second object, the bond comprising a coadunate interdiffusion layer, the coadunate interdiffusion layer comprising at least one unbroken contiguity between the first object, the second object, and an insert assembly comprising at least one or more insert features,
wherein forming the bond comprises heating the first object, the second object, and the insert assembly to a processing temperature to form a first interdiffusion portion between the first object and the filler material, a second interdiffusion portion between the second object and the filler material, and a third interdiffusion portion between the one or more insert features and the filler material: wherein the heating is performed to form the coadunate interdiffusion layer with an unbroken contiguity among the first interdiffusion portion, the second interdiffusion portion and the third interdiffusion portion; wherein the processing temperature is lower than a lowest melting temperature among melting temperatures of the first object, the second object, the insert feature, and the filler material.

11. The method of claim 10, wherein forming the bond comprises applying a minimum processing pressure of zero.

12. The method of claim 10, wherein the one or more insert features comprises a mesh structure.

13. The method of claim 10, wherein the one or more insert features comprises a columnar structure.

14. The method of claim 10, wherein the one or more insert features comprises a plurality of volumetrically dispersed insert features.

15. The method of claim 10, wherein the filler material comprises nanoparticulate silver, further wherein at least one of the one or more insert features comprises gold.

16. The method of claim 10, wherein disposing the insert assembly comprises forming at least one of the one or more insert features integrally with at least one of the first object and the second solid object.

17. The method of claim 10, wherein disposing the insert assembly is preceded by subjecting the insert assembly to a sintering process.

18. The method of claim 10, wherein forming the bond comprises forming the third interdiffusion layer, the third interdiffusion layer comprising forming a plurality of layers between the filler material and the at least one insert feature.

* * * * *